United States Patent
Hsieh et al.

(10) Patent No.: US 10,269,682 B2
(45) Date of Patent: Apr. 23, 2019

(54) COOLING DEVICES, PACKAGED SEMICONDUCTOR DEVICES, AND METHODS OF PACKAGING SEMICONDUCTOR DEVICES

(71) Applicant: Taiwan Semiconductor Manufacturing Company, Ltd., Hsin-Chu (TW)

(72) Inventors: Cheng-Chieh Hsieh, Tainan County (TW); Chi-Hsi Wu, Hsin-Chu (TW); Shin-Puu Jeng, Hsin-Chu (TW); Tsung-Yu Chen, Hsin-Chu (TW); Wensen Hung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 111 days.

(21) Appl. No.: 14/880,030

(22) Filed: Oct. 9, 2015

(65) Prior Publication Data

US 2017/0103937 A1    Apr. 13, 2017

(51) Int. Cl.
*H01L 23/427* (2006.01)
*H01L 23/367* (2006.01)
(Continued)

(52) U.S. Cl.
CPC ...... *H01L 23/4275* (2013.01); *H01L 23/3675* (2013.01); *H01L 23/427* (2013.01); *H01L 24/20* (2013.01); *H01L 25/105* (2013.01); *H01L 23/3128* (2013.01); *H01L 24/19* (2013.01); *H01L 2224/04105* (2013.01); *H01L 2224/12105* (2013.01); *H01L 2224/24137* (2013.01); *H01L 2224/32145* (2013.01); *H01L 2224/32225* (2013.01); *H01L 2224/32245* (2013.01);
(Continued)

(58) Field of Classification Search
CPC ........ H01L 23/34; H01L 23/36–23/373; H01L 23/3733–23/3735; H01L 23/427–23/4275; H01L 23/46–23/4735; H01L 21/563; H01L 2021/60–2021/6009; F28D 15/00–15/02; F28D 2015/0225
See application file for complete search history.

(56) References Cited

U.S. PATENT DOCUMENTS 5,173,766 A * 12/1992 Long ............... H01L 21/50
257/668
5,272,491 A * 12/1993 Asakawa ........... B41J 2/1408
165/104.33
(Continued)

OTHER PUBLICATIONS

Fujikura, "Heat Pipe", product description, http://www.directindustry.com/prod/fujikura/heat-pipes-16619-1083149.html, downloaded May 28, 2015, 21 pages.
(Continued)

*Primary Examiner* — Maliheh Malek
(74) *Attorney, Agent, or Firm* — Slater Matsil, LLP

(57) ABSTRACT

Cooling devices, packaged semiconductor devices, and methods of packaging semiconductor devices are disclosed. In some embodiments, a cooling device for a semiconductor device includes a reservoir having a first plate and a second plate coupled to the first plate. A cavity is between the first plate and the second plate. A phase change material (PCM) is in the cavity. The cooling device is adapted to dissipate heat from a packaged semiconductor device.

21 Claims, 12 Drawing Sheets

(51) Int. Cl.
  H01L 25/10 (2006.01)
  H01L 23/00 (2006.01)
  H01L 23/373 (2006.01)
  H01L 21/56 (2006.01)
  H01L 23/31 (2006.01)

(52) U.S. Cl.
  CPC ............ H01L 2224/73204 (2013.01); H01L 2224/73267 (2013.01); H01L 2224/9222 (2013.01)

(56) References Cited

U.S. PATENT DOCUMENTS

| | | | | |
|---|---|---|---|---|
| 5,663,106 A * | 9/1997 | Karavakis | ............... | H01L 21/56 257/791 |
| 5,985,697 A * | 11/1999 | Chaney | ............... | H01L 23/32 257/718 |
| 7,428,138 B2 * | 9/2008 | Mosley | ............... | H01G 4/008 361/311 |
| 7,538,422 B2 * | 5/2009 | Dangelo | ............... | H01L 23/373 257/706 |
| 7,545,030 B2 * | 6/2009 | Chrysler | ............... | H01L 23/373 257/686 |
| 7,564,115 B2 | 7/2009 | Chen et al. | | |
| 7,633,165 B2 | 12/2009 | Hsu et al. | | |
| 7,663,134 B2 * | 2/2010 | Lee | ............... | G11C 13/0004 257/4 |
| 7,705,424 B2 * | 4/2010 | Lee | ............... | G11C 11/5678 257/536 |
| 7,759,764 B2 * | 7/2010 | Lee | ............... | H01L 27/2445 257/517 |
| 7,825,024 B2 | 11/2010 | Lin et al. | | |
| 7,875,958 B2 * | 1/2011 | Cheng | ............... | B82Y 10/00 257/190 |
| 7,903,409 B2 * | 3/2011 | Patel | ............... | G06F 1/20 361/700 |
| 7,911,052 B2 * | 3/2011 | Vadakkanmaruveedu | ............... | H01L 23/427 257/712 |
| 7,932,507 B2 * | 4/2011 | Chen | ............... | B82Y 10/00 257/2 |
| 7,973,413 B2 | 7/2011 | Kuo et al. | | |
| 8,022,382 B2 * | 9/2011 | Lai | ............... | H01L 45/06 257/3 |
| 8,105,875 B1 | 1/2012 | Hu et al. | | |
| 8,158,456 B2 | 4/2012 | Chen et al. | | |
| 8,183,578 B2 * | 5/2012 | Wang | ............... | H01L 33/58 257/698 |
| 8,183,579 B2 | 5/2012 | Wang | | |
| 8,216,951 B2 * | 7/2012 | Cheng | ............... | B82Y 10/00 257/E21.353 |
| 8,227,902 B2 | 7/2012 | Kuo | | |
| 8,278,152 B2 | 10/2012 | Liu et al. | | |
| 8,344,349 B2 * | 1/2013 | Jedema | ............... | H01L 45/06 257/2 |
| 8,415,226 B2 * | 4/2013 | Kochupurackal | ............... | H01L 45/06 257/1 |
| 8,426,961 B2 * | 4/2013 | Shih | ............... | H01L 21/486 257/698 |
| 8,624,360 B2 * | 1/2014 | Ching | ............... | H01L 23/473 257/621 |
| 8,629,047 B2 * | 1/2014 | Cheng | ............... | B82Y 10/00 257/24 |
| 8,669,174 B2 * | 3/2014 | Wu | ............... | H01L 21/6835 438/108 |
| 8,792,265 B2 * | 7/2014 | In 'T Zandt | ............... | H01L 45/06 252/519.15 |
| 8,802,504 B1 | 8/2014 | Hou et al. | | |
| 8,803,292 B2 | 8/2014 | Chen et al. | | |
| 8,803,316 B2 | 8/2014 | Lin et al. | | |
| 8,860,160 B2 * | 10/2014 | Cheng | ............... | B82Y 10/00 257/25 |
| 8,937,381 B1 * | 1/2015 | Dunlap | ............... | H01L 23/3128 257/686 |
| 9,105,522 B2 * | 8/2015 | Cheng | ............... | B82Y 10/00 |
| 9,349,681 B1 * | 5/2016 | Kelly | ............... | H01L 24/81 |
| 9,472,279 B2 * | 10/2016 | Shih | ............... | G11C 13/0069 |
| 9,502,383 B2 * | 11/2016 | Wang | ............... | H01L 25/0657 |
| 9,559,712 B2 * | 1/2017 | Cheng | ............... | B82Y 10/00 |
| 9,685,393 B2 * | 6/2017 | Qiu | ............... | H01L 23/46 |
| 9,715,904 B2 * | 7/2017 | Rugg | ............... | G11B 33/1426 |
| 9,892,990 B1 * | 2/2018 | Galloway | ............... | H01L 23/34 |
| 9,918,407 B2 * | 3/2018 | Rosales | ............... | H01L 23/3735 |
| 2002/0033247 A1 * | 3/2002 | Neuschutz | ............... | F28D 20/02 165/10 |
| 2002/0056908 A1 * | 5/2002 | Brownell | ............... | F28D 15/0266 257/714 |
| 2002/0135984 A1 * | 9/2002 | Greenwood | ............... | H01L 23/3735 361/708 |
| 2003/0152764 A1 * | 8/2003 | Bunyan | ............... | C09K 5/063 428/328 |
| 2003/0153667 A1 * | 8/2003 | Jayaraman | ............... | C08K 3/08 524/432 |
| 2003/0183909 A1 * | 10/2003 | Chiu | ............... | H01L 23/04 257/667 |
| 2003/0203188 A1 * | 10/2003 | H | ............... | C09K 5/063 428/328 |
| 2004/0094192 A1 * | 5/2004 | Luo | ............... | H01L 35/30 136/203 |
| 2005/0041406 A1 * | 2/2005 | Matayabas, Jr. | ............... | C09K 5/063 361/784 |
| 2005/0078456 A1 * | 4/2005 | Mandel | ............... | H01L 21/4878 361/719 |
| 2005/0127500 A1 * | 6/2005 | Colgan | ............... | H01L 23/367 257/706 |
| 2005/0134507 A1 * | 6/2005 | Dishongh | ............... | H01L 23/36 343/700 MS |
| 2005/0191804 A1 * | 9/2005 | Lai | ............... | H01L 45/06 438/238 |
| 2006/0148229 A1 * | 7/2006 | Wang | ............... | H01L 45/06 438/593 |
| 2006/0181857 A1 * | 8/2006 | Belady | ............... | H01L 23/467 361/719 |
| 2006/0186440 A1 * | 8/2006 | Wang | ............... | H01L 45/06 257/246 |
| 2006/0261467 A1 * | 11/2006 | Colgan | ............... | H01L 23/04 257/707 |
| 2007/0001310 A1 * | 1/2007 | Hua | ............... | C09K 5/14 257/762 |
| 2007/0012905 A1 * | 1/2007 | Huang | ............... | H01L 45/06 257/2 |
| 2007/0231953 A1 * | 10/2007 | Tomita | ............... | H01L 21/4867 438/106 |
| 2007/0256761 A1 * | 11/2007 | Hwang | ............... | B23K 35/24 148/400 |
| 2008/0017975 A1 * | 1/2008 | Deppisch | ............... | H01L 23/42 257/706 |
| 2008/0079125 A1 * | 4/2008 | Lu | ............... | H01L 23/3735 257/675 |
| 2008/0094874 A1 * | 4/2008 | Liaw | ............... | G11C 11/16 365/148 |
| 2008/0116568 A1 * | 5/2008 | Laquer | ............... | H01L 23/44 257/712 |
| 2008/0128116 A1 * | 6/2008 | Dangelo | ............... | F28D 15/046 165/104.21 |
| 2008/0131722 A1 * | 6/2008 | Suhir | ............... | B32B 15/04 428/616 |
| 2008/0141681 A1 * | 6/2008 | Arnold | ............... | A41D 13/005 62/3.5 |
| 2008/0290467 A1 * | 11/2008 | Shue | ............... | H01L 27/2436 257/613 |
| 2008/0308782 A1 * | 12/2008 | Shue | ............... | G11C 11/5678 257/2 |
| 2009/0008779 A1 * | 1/2009 | Suhir | ............... | B82Y 10/00 257/751 |
| 2009/0026432 A1 * | 1/2009 | Liu | ............... | H01L 45/06 257/2 |

(56) References Cited

U.S. PATENT DOCUMENTS

| | | | |
|---|---|---|---|
| 2009/0085183 A1* | 4/2009 | Mitchell | H01L 23/10 257/686 |
| 2009/0230375 A1* | 9/2009 | Liang | H01L 45/06 257/2 |
| 2009/0283902 A1* | 11/2009 | Bezama | H01L 23/3675 257/713 |
| 2010/0091447 A1* | 4/2010 | Jaggers | G06F 1/20 361/679.47 |
| 2010/0123115 A1* | 5/2010 | Farnworth | H01L 21/563 257/3 |
| 2010/0155685 A1* | 6/2010 | Hurkx | H01L 45/06 257/3 |
| 2010/0252794 A1* | 10/2010 | Yeh | H01L 45/06 257/2 |
| 2010/0301303 A1* | 12/2010 | Wang | H01L 27/2436 257/4 |
| 2010/0308453 A1* | 12/2010 | Scheid | H01L 23/3675 257/698 |
| 2010/0328896 A1* | 12/2010 | Shaddock | B82Y 30/00 361/704 |
| 2011/0086498 A1* | 4/2011 | Cheng | B82Y 10/00 438/488 |
| 2011/0092041 A1* | 4/2011 | Lai | H01L 27/2409 438/381 |
| 2011/0140066 A1* | 6/2011 | Liang | H01L 45/06 257/2 |
| 2011/0189525 A1* | 8/2011 | Palanchon | H01M 10/615 429/120 |
| 2011/0253345 A1* | 10/2011 | Ryoson | F28D 15/0233 165/104.26 |
| 2011/0266511 A1* | 11/2011 | Shen | H01L 45/06 257/3 |
| 2012/0012804 A1* | 1/2012 | Chen | F28D 15/0233 257/2 |
| 2012/0104339 A1* | 5/2012 | Shen | H01L 45/06 257/2 |
| 2012/0187332 A1* | 7/2012 | Iruvanti | B82Y 30/00 252/73 |
| 2012/0309113 A1* | 12/2012 | Cheng | B82Y 10/00 438/3 |
| 2013/0048936 A1* | 2/2013 | Tsao | H01L 45/06 257/2 |
| 2013/0168050 A1* | 7/2013 | Chauhan | H01L 23/427 165/104.21 |
| 2013/0192794 A1* | 8/2013 | Chainer | H01L 23/40 165/67 |
| 2013/0206363 A1* | 8/2013 | Kirk | F28F 7/00 165/84 |
| 2013/0224510 A1* | 8/2013 | Deng | H01L 23/42 428/576 |
| 2013/0260511 A1* | 10/2013 | Chen | H01L 21/56 438/118 |
| 2013/0270690 A1* | 10/2013 | Hsieh | H01L 23/473 257/713 |
| 2014/0001645 A1 | 1/2014 | Lin et al. | |
| 2014/0048924 A1* | 2/2014 | Lee | H01L 23/42 257/713 |
| 2014/0090815 A1* | 4/2014 | Salamon | F28D 15/0266 165/104.26 |
| 2014/0167098 A1* | 6/2014 | Cheng | B82Y 10/00 257/104 |
| 2014/0225258 A1 | 8/2014 | Chiu et al. | |
| 2014/0247557 A1* | 9/2014 | Qiu | H01L 23/46 361/700 |
| 2014/0252572 A1 | 9/2014 | Hou et al. | |
| 2014/0264813 A1* | 9/2014 | Lin | H01L 21/563 257/690 |
| 2014/0367844 A1* | 12/2014 | Hooper | H01L 23/36 257/712 |
| 2015/0168087 A1* | 6/2015 | Kim | F28F 21/08 361/720 |
| 2015/0214128 A1* | 7/2015 | Lin | H01L 23/10 257/712 |
| 2015/0243609 A1* | 8/2015 | Lamorey | H01L 23/642 361/717 |
| 2015/0245723 A1* | 9/2015 | Alexander | A47G 19/027 99/483 |
| 2015/0255441 A1* | 9/2015 | Lamorey | H01L 25/18 257/704 |
| 2015/0262904 A1* | 9/2015 | Hung | H01L 23/367 257/713 |
| 2016/0093598 A1* | 3/2016 | Jo | H01L 25/18 257/713 |
| 2016/0150631 A1* | 5/2016 | Matsumoto | H05K 1/0204 361/720 |
| 2016/0218085 A1* | 7/2016 | Groothuis | H01L 23/13 |
| 2016/0381833 A1* | 12/2016 | Huang | B23P 15/26 165/80.3 |
| 2017/0025342 A1* | 1/2017 | Tseng | H01L 23/49833 |
| 2017/0084596 A1* | 3/2017 | Scanlan | H01L 25/50 |
| 2017/0092619 A1* | 3/2017 | Refai-Ahmed | H01L 25/0655 |
| 2017/0094831 A1* | 3/2017 | Khorrami | H01L 23/34 |
| 2017/0117205 A1* | 4/2017 | Groothuis | H01L 23/3675 |
| 2017/0125358 A1* | 5/2017 | Lamorey | H01L 23/3672 |
| 2017/0219303 A1* | 8/2017 | Kirk | F28F 7/00 |
| 2017/0222283 A1* | 8/2017 | Choi | H01M 10/4235 |
| 2017/0311478 A1* | 10/2017 | Engelhardt | H01L 23/4275 |
| 2017/0321100 A1* | 11/2017 | Zhang | C09K 5/14 |
| 2017/0338206 A1* | 11/2017 | Seo | H01L 25/0657 |
| 2017/0358558 A1* | 12/2017 | Lee | H01L 25/0657 |
| 2018/0012866 A1* | 1/2018 | Choi | H01L 25/0657 |
| 2018/0042139 A1* | 2/2018 | Rosales | H05K 7/2099 |
| 2018/0090415 A1* | 3/2018 | Escobar-Vargas | H01L 23/427 |
| 2018/0151472 A1* | 5/2018 | Chen | H01L 23/04 |
| 2019/0006263 A1* | 1/2019 | Yu | H01L 23/3738 |

OTHER PUBLICATIONS

Sharma, S.D., et al., "Phase Change Materials for Low Temperature Solar Thermal Applications," Res. Rep. Fac. Eng. Mie Univ., vol. 29, pp. 31-64 (2004).

"Heat Pipe Technology: Passive Heat Transfer for Greater Efficiency," Thermacore Thermal Management Solutions, http://www.thermacore.com/thermal-basics/heat-pipe-technology.aspx, downloaded May 28, 2015, 2 pages.

Wikipedia, "Heat Pipe", http://en.wikipedia.org/wiki/Heat_pipe, downloaded May 28, 2015, 11 pages.

* cited by examiner

COOLING DEVICES, PACKAGED SEMICONDUCTOR DEVICES, AND METHODS OF PACKAGING SEMICONDUCTOR DEVICES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts may be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
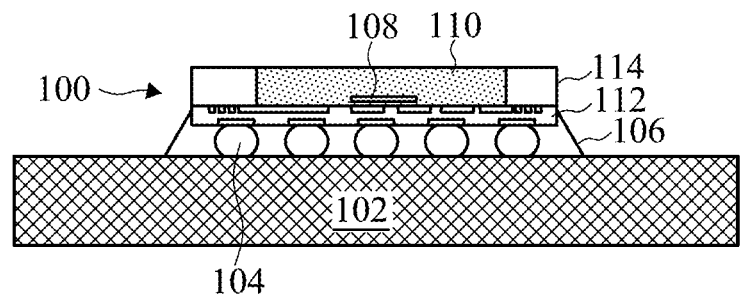
FIGS. 1 through 3 are cross-sectional views that illustrate a method of coupling a cooling device to a packaged semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Cooling devices, packaged semiconductor devices, and methods of packaging semiconductor devices are disclosed in the present disclosure. The cooling devices comprise portable heat reservoirs or heat reservoir bags that are implementable in portable electronic equipment, such as cellular phones, smart phones, tablets, notebooks, and other applications. The cooling devices are implementable in packaged semiconductor devices that may comprise one substrate attached to another substrate, wherein each substrate may be a die, wafer, printed circuit board, packaging substrate, or the like. The cooling devices thereby allowing for cooling of die-to-die, wafer-to-die, wafer-to-wafer, die or wafer to printed circuit board or packaging substrate types of packaging, or the like. Throughout the various views and illustrative embodiments, like reference numerals are used to designate like elements.

Figure 2:
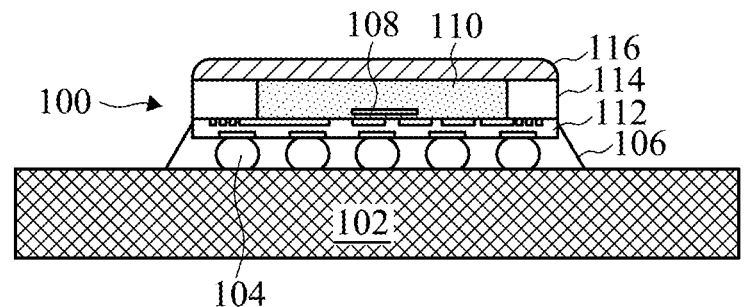
Figure 3:
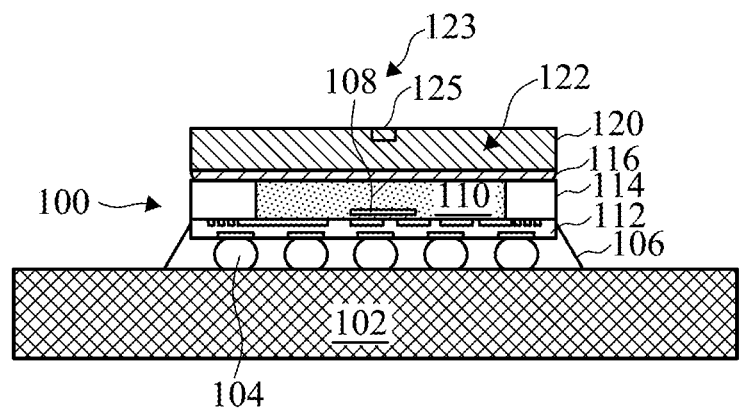

FIGS. 1 through 3 are cross-sectional views that illustrate a method of coupling a cooling device 120 (see FIG. 3) to a packaged semiconductor device 100 at various stages in accordance with some embodiments of the present disclosure. Referring first to FIG. 1, a packaged semiconductor device 100 is provided that includes an integrated circuit die 110 that has been packaged. The packaged semiconductor device 100 includes an interconnect structure 112 coupled to the integrated circuit die 110, and a molding material 114 disposed around the integrated circuit die 110 and over the interconnect structure 112. The packaged semiconductor device 100 comprises fan-out structures in some embodiments. For example, conductive wiring of the interconnect structure 112 may be spaced apart farther than conductive wiring of the integrated circuit die 110 is spaced. Likewise, the footprint of contact pads of the interconnect structure 112 may be larger than the footprint of contacts (not shown) of the integrated circuit die 110. The packaged semiconductor device 100 comprises an integrated fan-out (InFO) device or a WLP device in some embodiments. The packaged semiconductor device 100 may also comprise other types of packages.

The integrated circuit die 110 may comprise a substrate having electrical circuitry formed within or thereon. The substrate may comprise, for example, doped or undoped bulk silicon or an active layer of a semiconductor-on-insulator (SOI) substrate. The electrical circuitry of the substrate of the integrated circuit die 110 may be any type of circuitry suitable for a particular application. The integrated circuit die 110 may comprise a logic, memory, processor, or other type of device. As other examples, electrical circuitry formed within or on the substrate of the integrated circuit die 110 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other circuitry may be used as appropriate for a given application. The integrated circuit die 110 typically has been fabricated by forming a plurality of the integrated circuit dies 110 on a semiconductor wafer, and singulating the individual integrated circuit dies 110 along scribe lines.

A packaging process for the integrated circuit die 110 in some embodiments comprises providing a carrier (not shown), and attaching the integrated circuit die 110 to the carrier. The carrier may comprise a wafer, tape, or other type of support, substrate, or device that may be used for the packaging process as a platform for packaging one or more integrated circuit dies 110. The carrier is later removed after packaging a plurality of the integrated circuit dies 110 in some embodiments, for example.

In some embodiments, through-vias (not shown in FIGS. 1 through 3; see through-vias 142 shown in FIG. 23) are also formed over the carrier. The through-vias 142 may be plated on a seed layer formed on the carrier, for example. In some embodiments, through-vias 142 are not included. A plurality of the through-vias 142 may be formed in some embodiments over the carrier by plating, lithography, or other methods, before or after the plurality of the integrated circuit dies 110 is coupled to the carrier. The plurality of through-vias 142 may be formed using an electro-plating process, by depositing a seed layer over the carrier, and forming a patterned mask with a desired pattern for the through-vias 142 over the seed layer. The through-vias 142 are plated onto the carrier through the patterned mask, and the patterned mask is then removed. The exposed portions of the seed layer are also removed. The through-vias 142 may comprise copper, a copper alloy, or other metals or conductive materials. Dozens or hundreds of through-vias 142 may be included in a package for each of the integrated circuit dies 110 or groups of integrated circuit dies 110 that are packaged together, for example. The plurality of through-vias 142 provides electric connections in a vertical direction for the packaged semiconductor devices 100 in some embodiments. Each of the plurality of through-vias 142 may be positioned so that they will be coupled to a conductive portion of the interconnect structure 112 that will later be formed, for example.

A plurality of the integrated circuit dies 110 is coupled to the carrier between some of the plurality of through-vias 142 in some embodiments. The plurality of integrated circuit dies 110 is coupled to the carrier using a die attach film (DAF) (not shown) disposed on a bottom surface of the integrated circuit dies 110. The plurality of integrated circuit dies 110 may be placed on the carrier using a pick-and-place machine or manually, for example. Only one integrated circuit die 110 is shown in the drawings; in some embodiments, a plurality of the integrated circuit dies 110 is coupled to the carrier and is packaged simultaneously. The integrated circuit dies 110 or two or more integrated circuit dies 110 are later singulated along scribe lines (i.e., of the package or interconnect structure 112) to form a plurality of packaged semiconductor devices 100.

The molding material 114 is then formed over the carrier, over the integrated circuit die 110 and the through-vias 142, in embodiments wherein the through-vias 142 are included. The molding material 114 may comprise a molding compound comprised of an insulating material, such as an epoxy, a filler material, a stress release agent (SRA), an adhesion promoter, other materials, or combinations thereof, as examples. The molding material 114 may comprise a liquid or gel when applied so that it flows between a plurality of integrated circuit dies 110 being simultaneously packaged and around the through-vias 142, in some embodiments. The molding material 114 is then cured or allowed to dry so that it forms into a solid. A molding compound clamp may be applied during a curing process and a plasma treatment process of the molding material 114 in some embodiments. In some embodiments, as deposited, the molding material 114 extends over top surfaces of the plurality of integrated circuit dies 110 and the through-vias 142, and after the molding material 114 is applied, a top portion of the molding material 114 is removed using a planarization process, such as a chemical mechanical polish (CMP) process, a grinding process, an etch process, or combinations thereof, as examples. Other methods may also be used to planarize the molding material 114. A top portion of the integrated circuit dies 110 and/or through-vias 142 may also be removed during the planarization process for the molding material 114. In some embodiments, an amount of the molding material 114 applied may be controlled so that top surfaces of the integrated circuit die 110 and through-vias 142 are exposed. Other methods may also be used to form the molding material 114.

The interconnect structure 112 may then be formed over the planarized molding material 114, the integrated circuit dies 110, and the through-vias 142. The interconnect structure 112 comprises an RDL or PPI in some embodiments. The interconnect structure 112 may include one, two, or several conductive line layers and via layers. Some of the conductive lines of the interconnect structure 112 are coupled to contact pads (not shown) of the integrated circuit die 110. The conductive features or wiring of the interconnect structure may comprise copper, a copper alloy, or other metals formed by plating processes, lithography processes, and/or other methods formed within one or more insulating material layers, in some embodiments.

The carrier wafer is then removed. In some embodiments, a plurality of the packaged semiconductor devices 100 is then singulated to form the packaged semiconductor device 100 shown in FIG. 1 (for example, in an inverted view, with the interconnect structure 112 at the bottom). The packaged semiconductor devices 100 may be singulated using a saw or laser (not shown), which may include a blade comprising diamond or other materials in some embodiments, for example. One or more carriers may be used to package a semiconductor device.

In some embodiments, the interconnect structure 112 comprises a first interconnect structure formed on a first side of the integrated circuit die 110, and a second interconnect structure (not shown) is formed in addition to the first interconnect structure 112 on a second side of the integrated circuit die 110, the second side being opposite the first side, before singulating a plurality of the packaged semiconductor devices 100. For example, the previously described carrier may comprise a first carrier, and after the formation of the first interconnect structure 112, a second carrier may be attached to the first interconnect structure. The first carrier is removed, and the second interconnect structure is formed over the second side of the integrated circuit die 110, the through-vias 142, and the molding material 114. The second carrier is then removed, and the packaged semiconductor devices 100 are then singulated. The first interconnect structure 112 and the second interconnect structure may provide electrical connections in a horizontal direction for a plurality of packaged semiconductor devices 100 in some embodiments, for example. The second interconnect structure may comprise back-side routing, and the first interconnect structure 112 comprises front-side routing, or vice versa, e.g., relative to the integrated circuit die 110, for the packaged semiconductor devices 100 in some embodiments.

The methods of packaging semiconductor devices using one or more carriers described herein is merely an example: the integrated circuit dies 110 may be packaged using different methods or orders of methods of a packaging process.

In some embodiments, the packaged semiconductor device 100 is coupled to a substrate or printed circuit board (PCB) 102 by a plurality of connectors 104, as shown in FIG. 1. The connectors 104 may comprise a eutectic material such as solder, and the connectors 104 may be arranged in a ball grid array (BGA) that is fully or partially populated, for example. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder connectors 104 may also include tin and silver, Sn—Ag, without the use of copper. In some embodiments, the connectors 104 may comprise solder bumps or solder balls, as examples. The connectors 104 comprise conductive balls having a shape of a partial sphere in some embodiments. The connectors 104 may also comprise other shapes, such as non-spherical conductive connectors, for example. In some embodiments, the connectors 104 may comprise metal pillars (such as a copper pillars) formed by a sputtering, printing, electro plating, electroless plating, chemical vapor deposition (CVD), or the like. The metal pillars may be solder free and have substantially vertical sidewalls. In some embodiments, a metal cap layer (not shown) is formed on the top of the metal pillar connectors 104. The metal cap layer may include nickel, tin, tin-lead, gold, silver, palladium, indium, nickel-palladium-gold, nickel-gold, the like, or a combination thereof and may be formed by a plating process. The connectors 104 may also be used to couple the packaged semiconductor device 100 to other types of devices, such as to another packaged semiconductor device, an unpackaged semiconductor device, or directly in an end application, as examples.

In some embodiments, the interconnect structure 112 of the packaged semiconductor device 100 is coupled to the substrate or PCB 102 using the plurality of connectors 104, as illustrated in FIG. 1. The connectors 104 are coupled between contact pads (not shown) on the substrate or PCB 102 and contact pads of the interconnect structure 112. The connectors 104 are coupled to the contact pads of the substrate or PCB 102 by aligning the connectors 104 with the contact pads of the substrate or PCB 102, and heating the connectors 104 to the melting point of the eutectic material of the connectors 104, which reflows the material of the connectors 104. The material of the connectors 104 is allowed to cool, leaving the connectors 104 electrically and mechanically coupled to the contact pads of the substrate or PCB 102, and coupling the packaged semiconductor device 100 to the substrate or PCB 102.

An underfill material 106 may be applied between the connectors 104 and between the interconnect structure 112 and the substrate or PCB 102. The underfill material 106 may comprise a similar material as described for the molding material 114, for example. The underfill material 106 may be dispensed along one or more sides of the interconnect structure 112 along edge connectors 104, for example, and the underfill material 106 flows beneath the packaged semiconductor device 100 to the other side(s). The underfill material 106 is then cured or allowed to cure. In some embodiments, the underfill material 106 is not included.

In other embodiments, the packaged semiconductor device 100 is not coupled to a substrate or PCB 102, as shown in the embodiments illustrated in FIGS. 23 and 26, which will be described further herein. Likewise, the embodiments illustrated in FIGS. 1 through 3 and some of the other embodiments illustrated in the present disclosure may not be coupled to a substrate or PCB 102.

The integrated circuit die 110 may include hot spots 108 that become heated during operation. In accordance with some embodiments of the present disclosure, heat from the hot spots 108 is dissipated by implementing a cooling device 120 attached to the packaged semiconductor device 100, as shown in FIG. 3, which will be described further herein.

Figure 17:
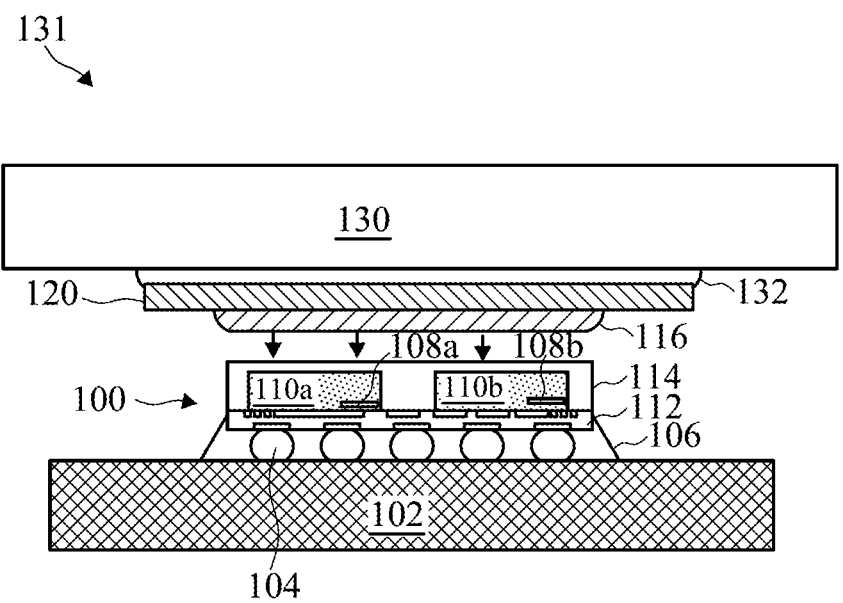
FIG. 17 is a cross-sectional view that shows a packaged semiconductor device that includes two integrated circuit dies being coupled to a cooling device and system part in accordance with some embodiments.

To attach the cooling device 120, a thermal interface material (TIM) 116 is applied to a top surface of the integrated circuit die 110 and a top surface of the molding material 114 in some embodiments, as illustrated in FIG. 2. The TIM 116 may comprise a polymer material or a solder material. In embodiments wherein the TIM 116 comprises a polymer material, the polymer material polymer material may form as a matrix-based polymer or an inorganic material such as a lightly crosslinked silicone polymer, one or more matrix polymers, a polymer with one or more thermally conductive fillers, as examples. The TIM 116 may comprise a thickness of about 20 μm to about 150 μm, as examples. The TIM 116 may also comprise other materials and dimensions. The TIM 116 may be applied by dispensing the TIM 116 onto the top surface of the integrated circuit die 110 and molding material 114. The dispensing process may be conducted using automatic dispenser equipment which may control the TIM 116 dispensing volume and patterns, such as serpentine, spiral, or other patterns, in order to achieve full coverage and a desired TIM 116 bond line thickness. The TIM 116 may also be applied using other methods. In some embodiments, the TIM 116 is applied to the cooling device 120, as shown in FIG. 17.

Referring next to FIG. 3, the cooling device 120 is coupled to the TIM 116 using an automated pick-and-place machine or equipment, or other methods. The cooling device 120 is coupled to the integrated circuit die 110 and the molding material 114 by the TIM 116 in some embodiments, for example. The cooling device 120 comprises a reservoir with a cavity inside (not shown in FIG. 3; see cavity 121 shown in FIG. 4) that contains a phase change material (PCM) 122. The PCM 122 comprises a high heat storage material, for example, in some embodiments. The PCM 112 may comprise heat storage properties with a latent heat of fusion larger than about 100 kJ/kg, for example. The PCM 122 may also comprise other levels of heat storage properties. The PCM 122 is adapted to change phase, such as between solid and a liquid, a liquid and a gas, or a solid and a gas. The PCM 122 may also be adapted to change phase between other states.

The PCM 122 comprises a material that changes phase at a relatively low melting point, such as about 100 degree C. or less, about 5 degrees C. to about 80 degrees C., or about 50 degrees C. or less, as examples. The PCM 122 may also be adapted to change phase at other temperatures. The PCM 122 may comprise wax, water, salt water, Agarose gel, N-Tetradeca, Formic Acid, N-Pentadeca, Acetic Acid, N-Hexadeca, Caprilone, Docasyle, N-Henicosan, Phenol, N-Lauric, P-Joluidine, Cynamide, N-Docosane, N-Tricosane, Hydrocinna, Cetyl, O-Nitroanili, Camphene, Diphenyl, N-Penta Cosane, Myristic Acid, Oxolate, Tristearin, O-Xylene, β-Chloroacetic, N-Hexacosane, Nitro Naphthalene, α-Chloroacetic, N-Octacosane, Palmitic Acid, Bees Wax, Glyolic Acid, P-Bromophenol, Azobenzene, Acrylic Acid, Dintro Toluene, Phenylacetic Acid, Thiosinamine, or a combination thereof, in some embodiments. The PCM 122 comprises a material having a relatively low melting temperature, such as less than about 50 degrees C. to about 100 degrees C. in some embodiments. The PCM 122 may comprise a material that is adapted to store a relatively large amount of heat per unit mass and volume and that is adapted to enable a phase change effect in some embodiments, as another example. The PCM 122 may also comprise other materials and properties.

The PCM 122 is applied inside the cavity 121 of the reservoir of the cooling device 120 through an opening 123 that is later closed or plugged with a plug 125 in some embodiments. The plug 125 is adapted to retain the PCM 122 within the cavity. The cooling device 120 advantageously provides cooling and thermal dissipation for the hot spot 108 of the integrated circuit die 110. The cooling device 120 is adapted to dissipate heat from the integrated circuit die 110, the interconnect structure 112, and/or the molding material 114 in some embodiments, for example.

Figure 4:
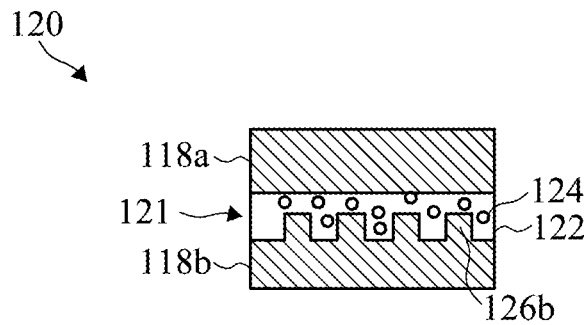
FIGS. 4 and 5 are cross-sectional views showing a portion of a cooling device in accordance with some embodiments.
Figure 5:
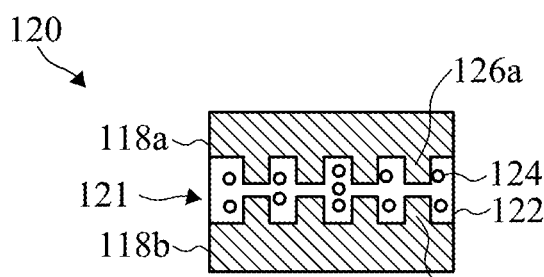

FIGS. 4 and 5 are cross-sectional views showing a portion of a cooling device 120 in accordance with some embodiments. The cooling device 120 includes a first plate 118a and a second plate 118b coupled to the first plate 118a. Edges of the first plate 118a and the second plate 118b are coupled together to form a reservoir having a cavity 121 between the two plates 118a and 118b. The PCM 122 is disposed between the first plate 118a and the second plate 118b within the cavity 121. The first plate 118a and the second plate 118b of the cooling device 120 may comprise a metal or a semiconductive material in some embodiments. The first plate 118a and the second plate 118b may comprise Cu, Cu/Ni, or Si, as examples. The first plate 118a and the second plate 118b may comprise relatively high thermal conductivity materials in some embodiments, for example, such as having a thermal conductivity of Si or greater. In some embodiments, the first plate 118a and the second plate 118b comprise a conformable material. A surface topology of the first plate 118a and the second plate 118b is adapted to conform to a surface of a package or packaged semiconductor device 100 in some embodiments, for example. The first plate 118a and the second plate 118b may also comprise other materials and properties.

The first plate 118a and/or the second plate 118b comprises a plurality of protruding features 126a or 126b, respectively, disposed thereon, in some embodiments. For example, in FIG. 4, the second plate 118b comprises a plurality of protruding features 126b that extend towards the first plate 118a. In FIG. 5, both the first plate 118a and the second plate 118b comprise a plurality of protruding features 126a or 126b, respectively, disposed thereon. The first plate 118a comprises a plurality of protruding features 126a that extend towards the second plate 118b, and the second plate 118b comprises a plurality of protruding features 126b that extend towards the first plate 118a. In some embodiments, protruding features 126a/126b are not included on the first plate 118a or the second plate 118b. The protruding features 126a/126b assist in heat dissipation of the cooling device 120 in some embodiments by, for example, increasing the surface area of the plates 118a/118b.

In some embodiments, the PCM 122 includes a filler material 124, as illustrated in FIGS. 4 and 5. The filler material 124 comprises a material that does not change phase in some embodiments. The filler material 124 may comprise indium, silver, tin, copper, bismuth particles, or a combination thereof, as examples. The filler material 124 may also comprise other materials. In some embodiments, a filler material 124 is not included in the PCM 122. The filler material 124 is combined with the phase change material of the PCM 122 in some embodiments, for example.

Figure 6:
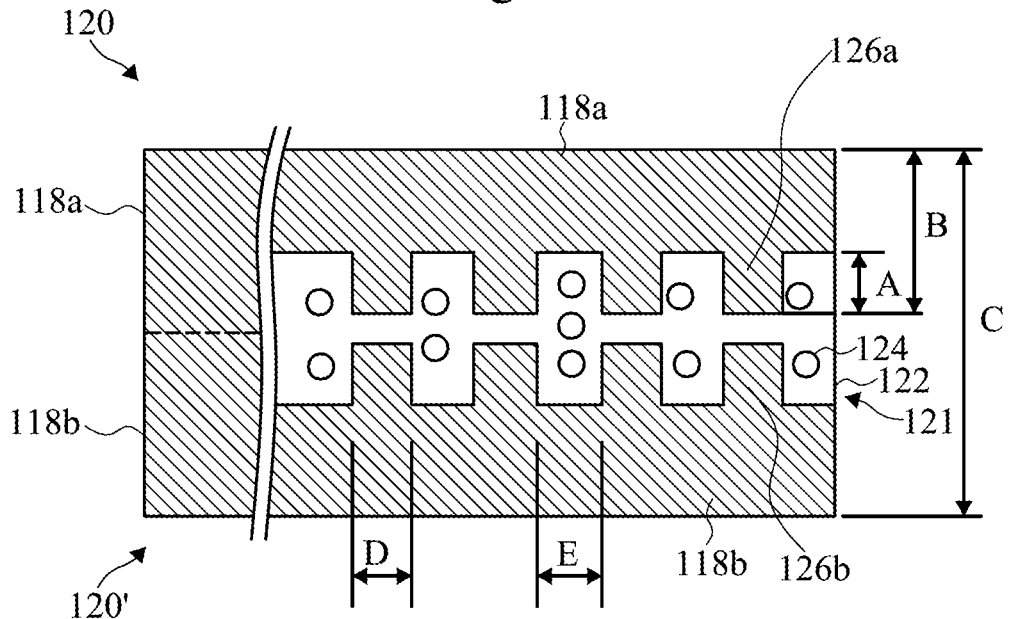
FIG. 6 is a more detailed view of FIG. 5 that illustrates some dimensions of protruding features and plates of the cooling device in accordance with some embodiments.

FIG. 6 is a more detailed view of FIG. 5 that illustrates some dimensions of the protruding features 126a and 126b and the plates 118a and 118b of the cooling device 120, and the cooling device 120, in accordance with some embodiments. The protruding features 126a and 126b may have a height comprising dimension A, wherein dimension A comprises about 10 µm to about 1,000 µm in some embodiments. The first plate 118a (and also the second plate 118b) may comprise a thickness comprising dimension B, wherein dimension B comprises about 50 µm to about 2,000 µm in some embodiments. The overall thickness of the cooling device 120 may comprise a thickness comprising dimension C, wherein dimension C comprises about 150 µm to about 4,000 µm in some embodiments. In some embodiments, dimension C comprises about 0.6 mm or less, as another example. The protruding features 126a and 126b may have a width comprising dimension D, wherein dimension D comprises about 5 µm to about 500 µm in some embodiments. The protruding features 126a and 126b may be spaced apart from adjacent protruding features 126a and 126b by a distance comprising dimension E, wherein dimension E comprises about 5 µm to about 500 µm in some embodiments. Dimensions A, B, C, D, and E may also comprise other values.

FIG. 6 also illustrates at 120' that edges of the first plate 118a and the second plate 118b of the cooling device 120 are coupled together. The cooling device 120 is formed using mechanical forging, sintered powder, or pressing methods in some embodiments, as examples. Thus, the first plate 118a and the second plate 118b comprise a continuous piece of material having a flask-like or flattened container shape in some embodiments. The exterior portion of the cooling device 120 comprises a sealed assembly of the first plate 118a and the second plate 118b, for example. The cooling device 120 is hermetically sealed in some embodiments, for example. The cooling device 120 may also be formed using other methods. In some embodiments, the opening 123 (see FIG. 3) may be located proximate an edge of the first plate 118a, proximate an edge of the second plate 118b, or proximate both an edge of the first plate 118a and an edge of the second plate 118b (see FIG. 25 at 123'), for example. The edges of the first plate 118a and the second plate 118b may be sealed except at the opening 123 or 123' in some embodiments, for example (not shown).

Figure 7:
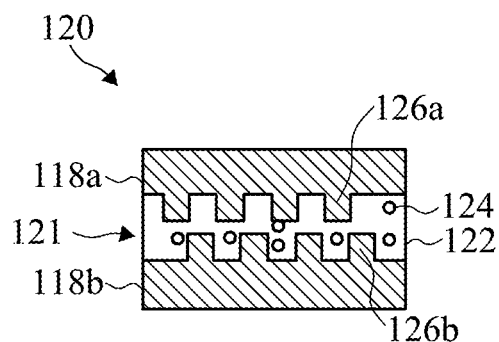
FIG. 7 is a cross-sectional view showing a portion of a cooling device in accordance with some embodiments.

In FIGS. 5 and 6, the protruding features 126a and 126b are aligned. FIG. 7 is a cross-sectional view showing a portion of a cooling device 120 in accordance with some embodiments, wherein the protruding features 126a and 126b of the first plate 118a and the second plate 118b, respectively, are staggered.

Figure 8:
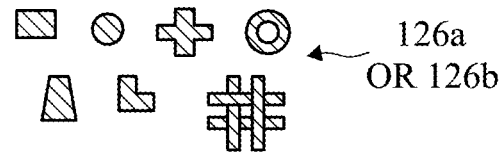
FIG. 8 shows various shapes of protruding features of a cooling device in top or bottom views in accordance with some embodiments.

FIG. 8 is a top view (or bottom view) showing some exemplary shapes of protruding features 126a and 126b of a cooling device 120 in accordance with some embodiments. The protruding features 126a and 126b may comprise a shape of a square, rectangle, circle, cross, ring, trapezoid, L, or mesh, in a top or bottom view, as examples. The protruding features 126a and 126b may also comprise other shapes in a top or bottom view of the cooling device 120.

Figure 9:
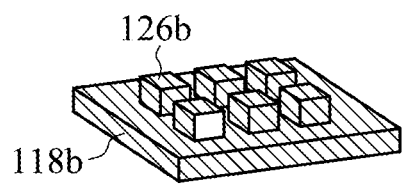
FIGS. 9 and 10 illustrate perspective views of protruding features of a cooling device in accordance with some embodiments.
Figure 10:
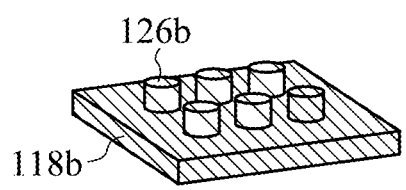

FIGS. 9 and 10 illustrate perspective views of protruding features 126b of a second plate 118b of a cooling device 120 in accordance with some embodiments. In FIG. 9, the protruding features 126b of the second plate 118b of the cooling device 120 comprise a plurality of square or rectangular shaped features, and in FIG. 10, the protruding features 126b of the second plate 118b of the cooling device 120 comprise a plurality of cylindrical shaped features. Likewise, protruding features 126a of a first plate 118a of the cooling device 120 may comprise similar shapes. The protruding features 126a and 126b may also comprise other shapes in a perspective view.

Figure 11:
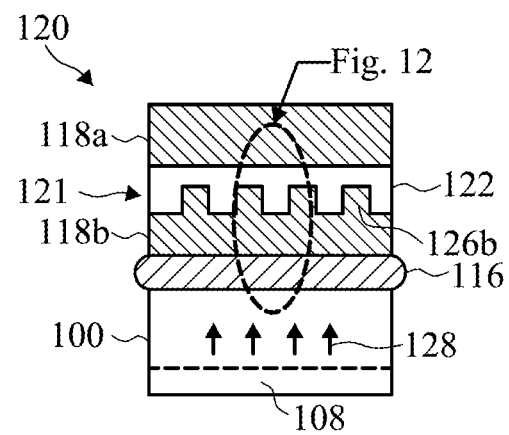
FIG. 11 is a cross-sectional view that illustrates a cooling principle of a cooling device in accordance with some embodiments.
Figure 12:
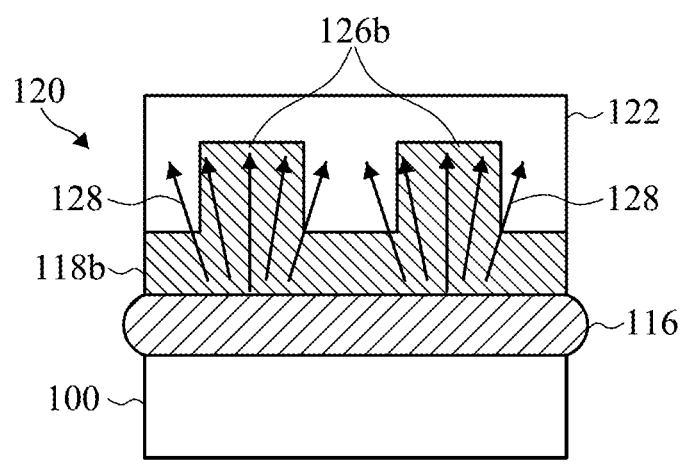
FIG. 12 shows a more detailed view of a portion of FIG. 11 in accordance with some embodiments.

FIG. 11 is a cross-sectional view that illustrates a cooling principle of the cooling device 120 in accordance with some embodiments. As a hot spot 108 of the integrated circuit die 110 of the packaged semiconductor device 100 becomes hot during operation, heat 128 generated from the hot spot 108 dissipates through the TIM 116 to the second plate 118b of the cooling device 120. FIG. 12 is a more detailed view of a portion of FIG. 11 in accordance with some embodiments, illustrating the heat 128 transferred to the second plate 118b and dissipating through the protruding features 126b and a base of the second plate 118b from which the protruding features 126b extend. The protruding features 126b advantageously increase a surface area of the second plate 118b and improve the heat 128 transfer from the hot spot 108 to the PCM 122. The second plate 118b and the protruding features 126b of the second plate 118b dissipate the heat 128 to the PCM 122, which changes the phase of the PCM 122, i.e., melting the PCM 122 (e.g., changing a solid to a liquid) or changing a solid or liquid to a gas, depending on the material of the PCM 122. The phase change of the PCM 122 also results in a cooling or reduction in temperature of the hot spot 108 of the integrated circuit die 110.

The PCM 122 comprises a latent heat storage material, for example. As the PCM 122 is exposed to an increase in temperature such as the heat 128, the chemical bonds within the PCM 122 break up as the material changes phase. The phase change is a heat-seeking (endothermic) process and thus, the PCM 122 absorbs the heat 128. Upon storing the heat 128 in the PCM 122, which functions as a heat storage material, the PCM 122 begins to change phase when the phase change temperature is reached. The temperature of the PCM 122 then remains substantially constant until the phase change process is finished. After reaching a phase change condition, the PCM 122 stays in the phase change state (e.g., such as a liquid state) until the device temperature cools down below the melting point, at which point the PCM 122 begins to transform back to the non-phase change state (e.g., such as a solid state). The PCM 122 is then ready to store heat for another device heating cycle. Thus, the PCM 122 absorbs the heat 128, which results in the cooling of the hot spot 108.

Figure 13:
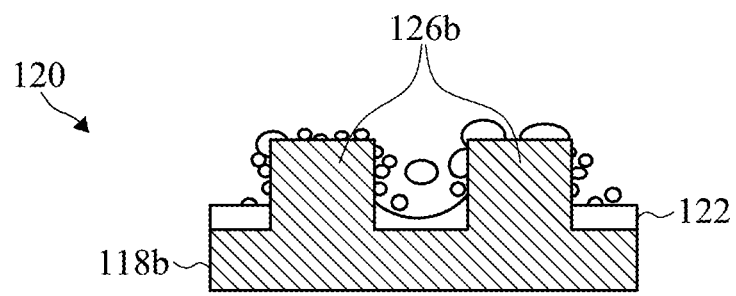
FIGS. 13 and 14 are cross-sectional views that illustrate phase changes of a phase change material (PCM) of a cooling device in accordance with some embodiments.
Figure 14:
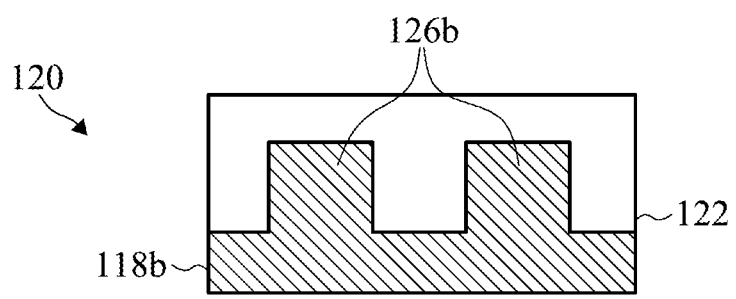

FIGS. 13 and 14 further illustrate phase changes of a PCM 122 of a cooling device in accordance with some embodiments, in some embodiments wherein the PCM 122 comprises a material with a solid or liquid to gas phase change. A phase-change heat transfer occurs during the phase change of the PCM 122, for example. In FIG. 13, when a hot spot 108 proximate the second plate 118b and protruding features 126b of the second plate 118b increases in temperature, a capillary flow is generated in the PCM 122, and the PCM 122 becomes more fluid and eventually at least part gas or vapor phase. After the hot spot 108 has cooled from the phase change, the PCM 122 returns to the original solid or liquid state, due to condensation during the cooling process, as shown in FIG. 14. Other phase changes may take place during the heating and cooling of the hot spot 108, depending on the material of the PCM 122, such as solid to liquid back to solid, for example.

In FIGS. 4 through 7 and 14, a PCM 122 is shown in the drawings that substantially fills the cavity 121. However, in accordance with some embodiments of the present disclosure, the PCM 122 volume when in a solidified or liquid state comprises about 30% to 80% of the cavity 121 volume, to allow for expansion during a phase change to a liquid state or gas/vapor state within the cavity 121. For example, the cavity 121 may comprise a first volume, and the PCM 122 in a non-phase-changed state may comprise a second volume, wherein the second volume comprises about 30% to 80% of the first volume.

Figure 15:
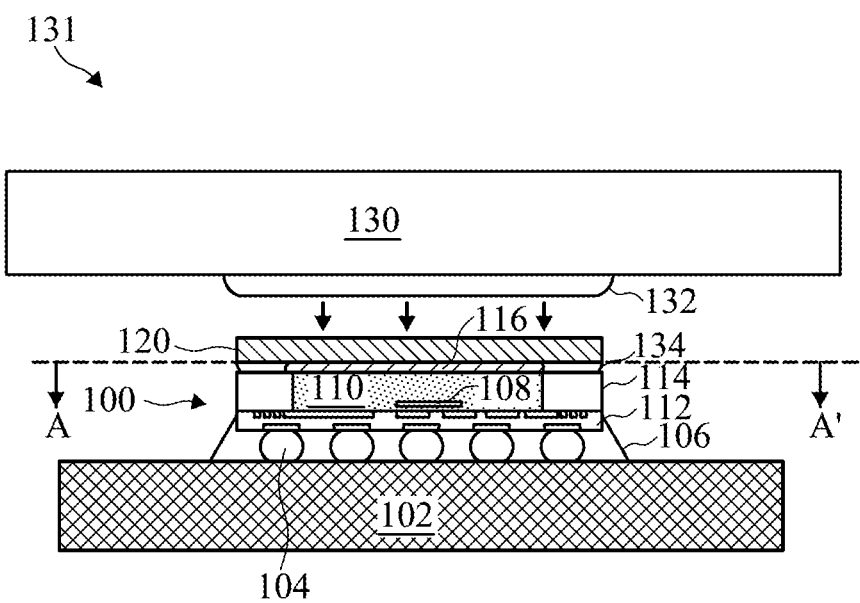
FIG. 15 is a cross-sectional view that shows a packaged semiconductor device that includes a cooling device coupled thereto being coupled to a system part in accordance with some embodiments.

FIG. 15 is a cross-sectional view that shows a packaged semiconductor device 100 that includes a cooling device 120 coupled thereto being coupled to a system part 130 of a system 131 in accordance with some embodiments. The system part 130 may comprise a case, chassis, or housing in some embodiments. The system part 130 may also comprise other components or elements of the system 131. In some embodiments wherein the cooling device 120 is implemented in a hand-held device (which is also referred to herein generally as a system 131), the system part 130 may comprise a case or housing of the hand-held device or system 131, for example. The cooling device 120 includes a first side and a second side opposite the first side. The first side of the cooling device 120 is coupled to the integrated circuit die 110 and the molding material 114, and the second side of the cooling device 120 is coupled to the system part 130 of the system 131.

In some handheld applications, a term $T_{skin}$ is sometimes used, which refers to a temperature of a portion of a handheld device such as a case, chassis, or housing that may have physical contact with human skin. The maximum temperature for $T_{skin}$ is sometimes referred to as Max Tskin, which refers to a maximum allowable temperature of the portion of the device that human skin can tolerate to avoid discomfort while holding or wearing the device, for example. The value of Max $T_{skin}$ that is sometimes used is 45 degrees C., for example. An advantage of some embodiments of the present disclosure in the implementation of the cooling device 120 in a handheld electronic device or system 131 is that maintaining a temperature of Max $T_{skin}$ or less may be achieved of a system part 130 such as a case, chassis, or housing, without degrading integrated circuit die 110 performance. Thermal run-away of integrated circuit dies 110 from hot spots 108 and thermal cross-talk may be avoided by implementing the cooling devices 120 described herein, and improved electrical performance and reliability may be achieved. The cooling device 120 thermally contacts an exposed integrated circuit die 110 in some of the embodiments shown herein, for example. The cooling device 120 may provide improved heat conduction and more effective integrated circuit die 110 transient cooling, as another example.

FIG. 15 also illustrates a gap filler material 132 that may be coupled between the system part 130 and the cooling device 120 in some embodiments. The gap filler material 132 may comprise a TIM such as a grease, a gel, or an elastomer, as examples, or other materials. In other embodiments, the gap filler material 132 is not included. A first side of the cooling device 120 is coupled to the integrated circuit die 110 and the molding material 114, and a second side of the cooling device 120 is coupled to a system part 130 of the system 131 by the gap filler material 132 in some embodiments, for example.

An adhesive 134 such as an epoxy, a glue, a thermally conductive adhesive, or other materials may also be disposed between the molding material 114 and the cooling device 120 in some embodiments. The adhesive 134 may comprise a thickness of about 10 μm to about 100 μm, for example. The adhesive 134 may also comprise other dimensions. The TIM 116 is disposed between the integrated circuit die 110 and the cooling device 120. In other embodiments, the adhesive 134 is not included, and the TIM 116 is also disposed between the molding material 114 and the cooling device 120, as shown in FIG. 3.

Figure 16:
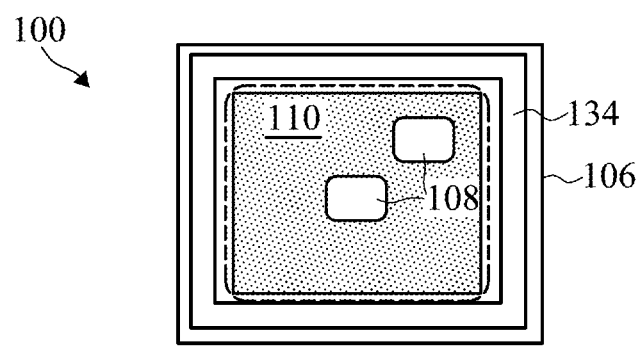
FIG. 16 is a top view of a portion of the packaged semiconductor device shown in FIG. 15 that illustrates hot spots on an integrated circuit die in accordance with some embodiments.

FIG. 16 is a top view of a portion of the packaged semiconductor device 100 shown in FIG. 15 along a view shown at 15-15' in FIG. 15, illustrating hot spots 108 on an integrated circuit die 110 in accordance with some embodiments. One or more hot spots 108 may reside in regions of an integrated circuit die 110 of a packaged semiconductor device 100 in some applications, for example. The hot spots 108 may occur because of increased current flow or chip-consuming power to activate the circuitry of the integrated circuit die 110 in those regions while executing different operation workloads, for example. The cooling device 120 advantageously provides cooling for, and heat diffusion and transfer, away from the hot spots 108 of the integrated circuit die 110.

Figure 18:
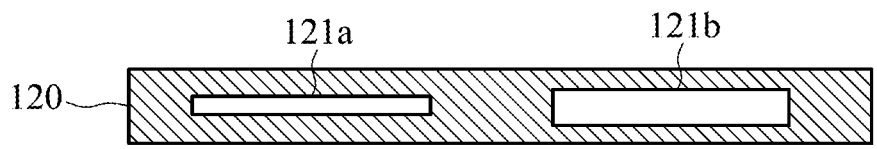
FIG. 18 is a top view showing two regions of the cooling device shown in FIG. 17 in accordance with some embodiments.
Figure 19:
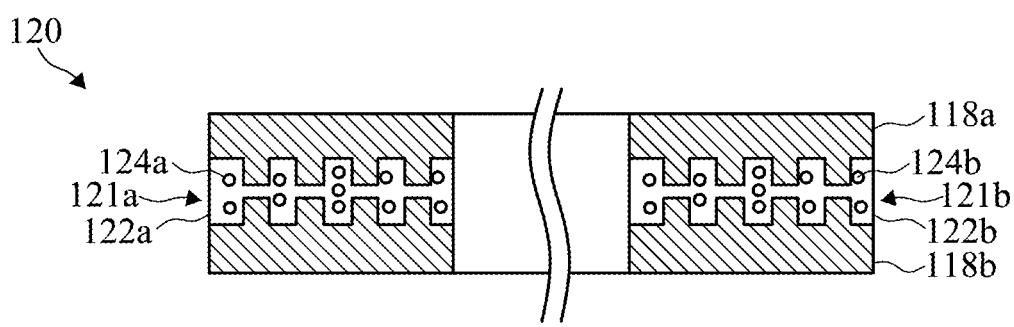
FIG. 19 is a cross-sectional view of the two regions of the cooling device shown in FIG. 18 in accordance with some embodiments.

FIG. 17 is a cross-sectional view illustrating a packaged semiconductor device 100 that includes two integrated circuit dies 110a and 110b that is being coupled to a cooling device 120 in accordance with some embodiments. In accordance with some embodiments, different materials may be used for the PCM 122 within the cooling device 120 for each of the integrated circuit dies 110a and 110b. FIG. 18 is a top view showing two regions of the cooling device 120 shown in FIG. 17, and FIG. 19 is a cross-sectional view of the two regions of the cooling device 120 shown in FIG. 18 in accordance with some embodiments. The cooling device 120 includes two cavities 121a and 121b with a different PCM 122a and 122b, respectively, disposed within each cavity 121a and 121b in the two regions, respectively. The PCMs 122a and 122b may also include a filler material 124a and 124b, respectively. In other embodiments, a filler material 124a and/or 124b is not included.

Thus, in some embodiments, a cooling device 120 for a semiconductor device includes a reservoir comprising a first plate 118a and a second plate 118b coupled to the first plate 118a, and a first cavity 121a disposed between the first plate 118a and the second plate 118b. A first PCM 122a is disposed in the first cavity 121a. The cooling device 120 comprises a second cavity 121b disposed between the first plate 118a and the second plate 118b, and a second PCM 122b disposed in the second cavity 121b. The second PCM 122b comprises a different material than the first PCM 122a in some embodiments.

Some of the embodiments shown in FIGS. 17 through 19 enable different heat dissipation rates or amounts and different cooling rates for the various integrated circuit dies 110a and 110b of the packaged semiconductor device 100. The first PCM 122a may comprise wax and the second PCM 122b may comprise water, as an example. The cooling device 120 may also comprise three or more regions that have two or more different PCMs in the various regions, corresponding to cooling requirements for three or more integrated circuit dies 110 included in a packaged semiconductor device 100, for example.

In some embodiments, the second PCM 122b may comprise the same material as the first PCM 122a. In other embodiments, the first PCM 122a may include a filler material 124a, and the second PCM 122b may not include a filler material, as another example. The first PCM 122a and the second PCM 122b may advantageously be custom designed to provide adequate cooling for the respective integrated circuit dies 110a and 110b that will be positioned proximate the cavities 121a and 121b, respectively, in the packaged semiconductor device 100 and/or the system 131, in some embodiments.

FIG. 17 also illustrates that the cooling device 120 may first be coupled to the system part 130, and the TIM 116 may be applied to the cooling device 120, in some embodiments. The TIM 116 is then coupled to the integrated circuit dies 110a and 110b and the molding material 114. FIG. 17 further illustrates that a portion of the molding material 114 may reside over top surfaces of an integrated circuit die or dies 110a and 110b, in some embodiments.

Figure 20:
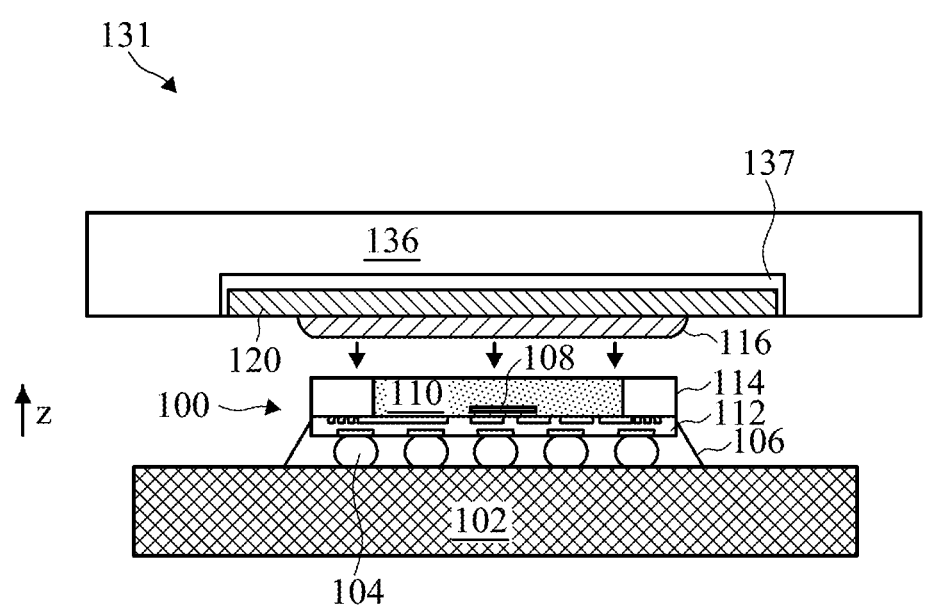
FIG. 20 is a cross-sectional view that shows a cooling device that is integrated with a heat sink being coupled to a packaged semiconductor device in accordance with some embodiments.

FIG. 20 is a cross-sectional view that shows a cooling device 120 that is integrated with a heat sink 136 that is being coupled to a packaged semiconductor device 100 in accordance with some embodiments. Note that in FIGS. 15 and 17, the systems 131 are shown at a stage in which they are in the process of being assembled. After the connections indicated by the arrows, the gap including the arrows has been removed and the elements of the system 131 are connected vertically. Likewise, the system 131 shown in FIG. 20 including the heat sink 136 comprises elements that are connected vertically after the connections indicated by the arrows.

In FIG. 20, the cooling device 120 is an integral part of the heat sink 136 in some embodiments, for example. The heat sink 136 may comprise a material such a copper, aluminum, magnesium, or alloys thereof, as examples. The heat sink 136 may comprise a thickness of about 0.22 mm to about 2 mm in some embodiments. The heat sink 136 may also comprise other materials and dimensions.

For example, the heat sink 136 illustrated in FIG. 20 has a recess formed therein, and the cooling device 120 is disposed within the recess. The cooling device 120 is retained within the recess in the heat sink 136 by an adhesive 137 comprising a thermal conductive adhesive, an alloy soldering material, a combination thereof, or other materials, as examples. The adhesive 137 may comprise a thickness of about 50 µm to about 200 µm, for example. The adhesive 137 may also comprise other dimensions. The overall package or system 131 z-profile (e.g., in a z direction) may advantageously be reduced by integrating the cooling device 120 into a heat sink 136 as illustrated in FIG. 20. Furthermore, effective integrated circuit die 110 transient cooling is provided by including the cooling device 120 in the heat sink 136.

Figure 21:
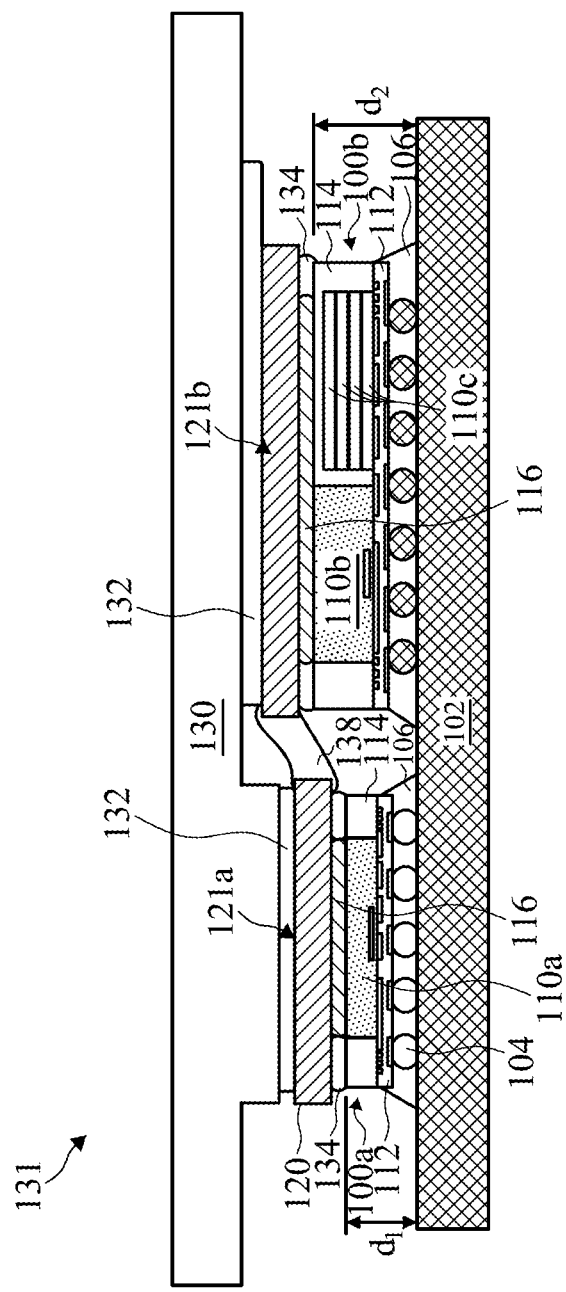
FIG. 21 illustrates a cross-sectional view of a cooling device that includes a conformable member in accordance with some embodiments.

FIG. 21 illustrates a cross-sectional view of a cooling device 120 that includes a conformable member 138 and that is implemented in a system 131 in accordance with some embodiments. The system part 130 comprises a thicker portion proximate packaged semiconductor device 100a to accommodate for package height variations. The cooling device 120 includes conformal thermal contact features, for example. In some embodiments, the conformable member 138 comprises a bendable region of the first plate 118a and the second plate 118b. The first plate 118a and the second plate 118b may comprise a material that is conformable, for example. The first plate 118a and second plate 118b may comprise a bending region that is fabricated via a mechanical bending process with a molding tool in some embodiments, for example. The first plate 118a and the second plate 118b may also comprise a material having a sufficient thickness so that it is conformable, in some embodiments. Cooling devices 120 having thin first plate 118a and second plate 118b material may be bendable in a packaging process line by an operator or a machine, for example. The PCM 122 may be contained in a single cavity 121 as described for the embodiments shown in FIGS. 3 through 7, or the PCM 122a and 122b may be contained in two cavities 121a and 121b as described for the embodiments shown in FIGS. 17 through 19.

In other embodiments, the conformable member 138 comprises an elastomer sheet, elastomer membrane, or other conformable and bendable material. The elastomer materials may comprise high temperature polyimide films or other materials. For example, polyimide may sustain a high temperature environment up to about 400 degrees C. The cooling device 120 may comprise a composite cooling device comprised of two cooling portions, with each cooling portion having a cavity 121a and 121b formed therein, respectively, that contains the PCM 122. The PCM 122 may comprise the same material in each cavity 121a and 121b as described for the embodiments shown in FIGS. 3 through 7, or the PCM 122a and 122b may comprise different materials in each cavity 121a and 121b, respectively, as described for the embodiments shown in FIGS. 17 through 19.

Thus, in some embodiments, a first portion of the cooling device 120 comprising a first cavity 121a is coupled to a second portion of the cooling device 120 comprising a second cavity 121b by a conformable member 138. The first cavity 121a may comprise a first PCM 122a, and the second cavity 121b may comprise a second PCM 122b. The first PCM 122a and the second PCM 122b may comprise the same or different materials.

A cooling device 120 including a conformable member 138 advantageously provides an ability to accommodate multiple package heights on the same substrate or PCB 102 within the system 131. For example, in FIG. 21, packaged semiconductor device 100a and connectors 104 comprise a height comprising dimension $d_1$, and packaged semiconductor device 100b and connectors 104 comprise a height comprising dimension $d_2$, wherein dimension $d_2$ is greater than dimension $d_1$. Dimension $d_1$ may comprise about 100 µm to about 500 µm, and dimension $d_2$ may comprise about 100 µm to about 800 µm, as examples. Dimensions $d_1$ and $d_2$ may also comprise other values. The conformable member 138 also provides the ability to accommodate a variety of shapes of the system part 130.

FIG. 21 also illustrates that two different types of packaged semiconductor devices 100a and 100b may be coupled to a substrate or PCB 102 in a system 131. Packaged semiconductor device 100a includes one integrated circuit die 110a, as described for the embodiments shown in FIG. 15. Packaged semiconductor device 100b includes an integrated circuit die 110a that is packaged horizontally with a stack of vertically stacked integrated circuit dies 110c. Four integrated circuit dies 110c are shown in the vertical stack; however, two, three, or five or more integrated circuit dies 110c may be vertically stacked. Electrical connections between the integrated circuit dies 110c may be made by contact pads and/or through-vias, as examples. Other methods and structures may also be used to establish vertical electrical connections between the integrated circuit dies 110c. The interconnect structure 112 of the packaged semiconductor device 100b may include horizontal connections between integrated circuit die 110b and the vertical stack of integrated circuit dies 110c, for example. The substrate or PCB 102 may, or may not, include wiring that provides horizontal electrical connections between the two packaged semiconductor devices 100a and 100b within the system 131, for example.

Thus, in accordance with some embodiments, a first packaged semiconductor device 100a that includes the integrated circuit die 110a, the interconnect structure 112, and the molding material 114 is coupled to the cooling device 120, and a second packaged semiconductor device 100b is also coupled to the cooling device 120. Additional packaged semiconductor devices (not shown) may also be coupled to the cooling device 120 and may have different heights, by the inclusion of the conformable members 138 in the cooling device 120, in some embodiments.

Figure 22:
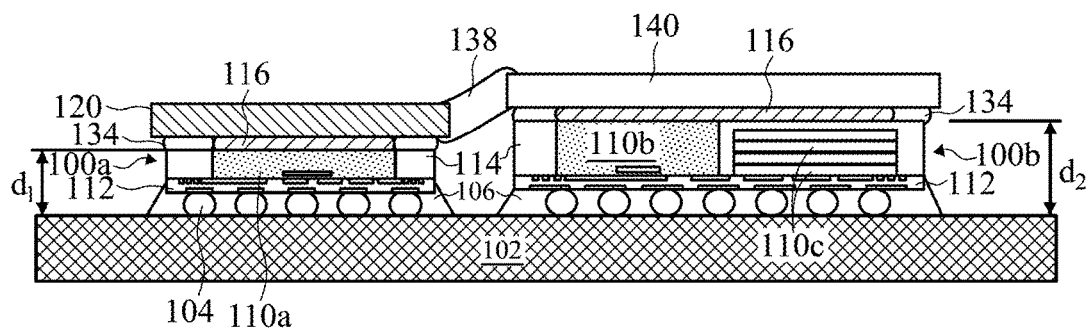
FIG. 22 shows a cross-sectional view of a cooling device that is coupled to a heat pipe in accordance with some embodiments.

FIG. 22 shows a cross-sectional view of a cooling device 120 that is coupled to a heat pipe 140 in accordance with some embodiments. A cooling device 120 described herein may be integrated with a heat pipe 140, for example, by a conformable member 138 comprising an elastomer sheet, an elastomer membrane, or other object or material. A cooling device 120 including a conformable member 138 and coupled to a heat pipe 140 advantageously provides an ability to accommodate multiple package heights on the same substrate or PCB 102. The cooling device 120 may be coupled to a first packaged semiconductor device 100a, and the heat pipe 140 may be coupled to a second packaged semiconductor device 100b. Likewise, the cooling device 120 may be coupled to a first integrated circuit die 110a, and the heat pipe 140 may be coupled to a second integrated circuit die 110b and/or 110c, in some embodiments.

In other embodiments, the heat pipe 140 may be coupled to the cooling device 120 using a non-conformable member, not shown. The cooling device 120 and the heat pipe 140 may also be coupled to the same packaged semiconductor device 100a or 100b, for example, also not shown.

Figure 23:
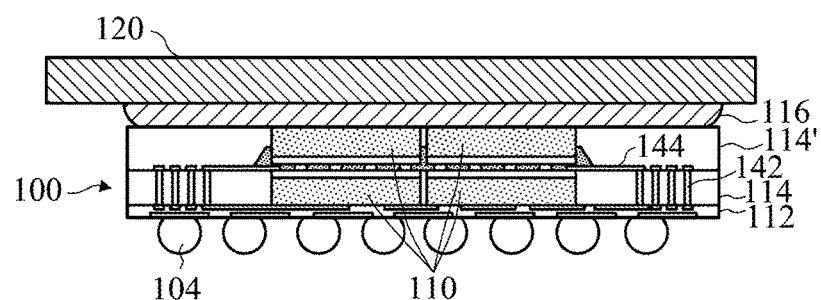
FIG. 23 is a cross-sectional view illustrating a cooling device coupled to a packaged semiconductor device that includes a plurality of horizontally and vertically packaged integrated circuit dies in accordance with some embodiments.

FIG. 23 is a cross-sectional view illustrating a cooling device 120 coupled to a packaged semiconductor device 100 that includes a plurality of horizontally and vertically packaged integrated circuit dies 110 in accordance with some embodiments. The packaged semiconductor device 100 may comprise an InFO hybrid vertical stacking device in some of the embodiments shown, for example. The packaged semiconductor device 100 includes two horizontally positioned integrated circuit dies 110 that are disposed in a first molding material 114 over an interconnect structure 112. Through-vias 142 are formed in the first molding material 114 around the integrated circuit dies 110. An integrated circuit die 110 is vertically stacked over each of the horizontally positioned circuit dies 110, and the vertically stacked integrated circuit dies 110 are horizontally positioned within a second molding material 114'. The cooling device 120 is coupled to the upper integrated circuit dies 110 and the second molding material 114' by the TIM 116. Thus, the cooling device 120 may be implemented in packaged semiconductor devices 100 that include a plurality of horizontally oriented integrated circuit dies 110, a plurality of vertically stacked integrated circuit dies 110, or both a plurality of horizontally oriented integrated circuit dies 110 and a plurality of vertically stacked integrated circuit dies 110, in accordance with some embodiments.

Figure 24:
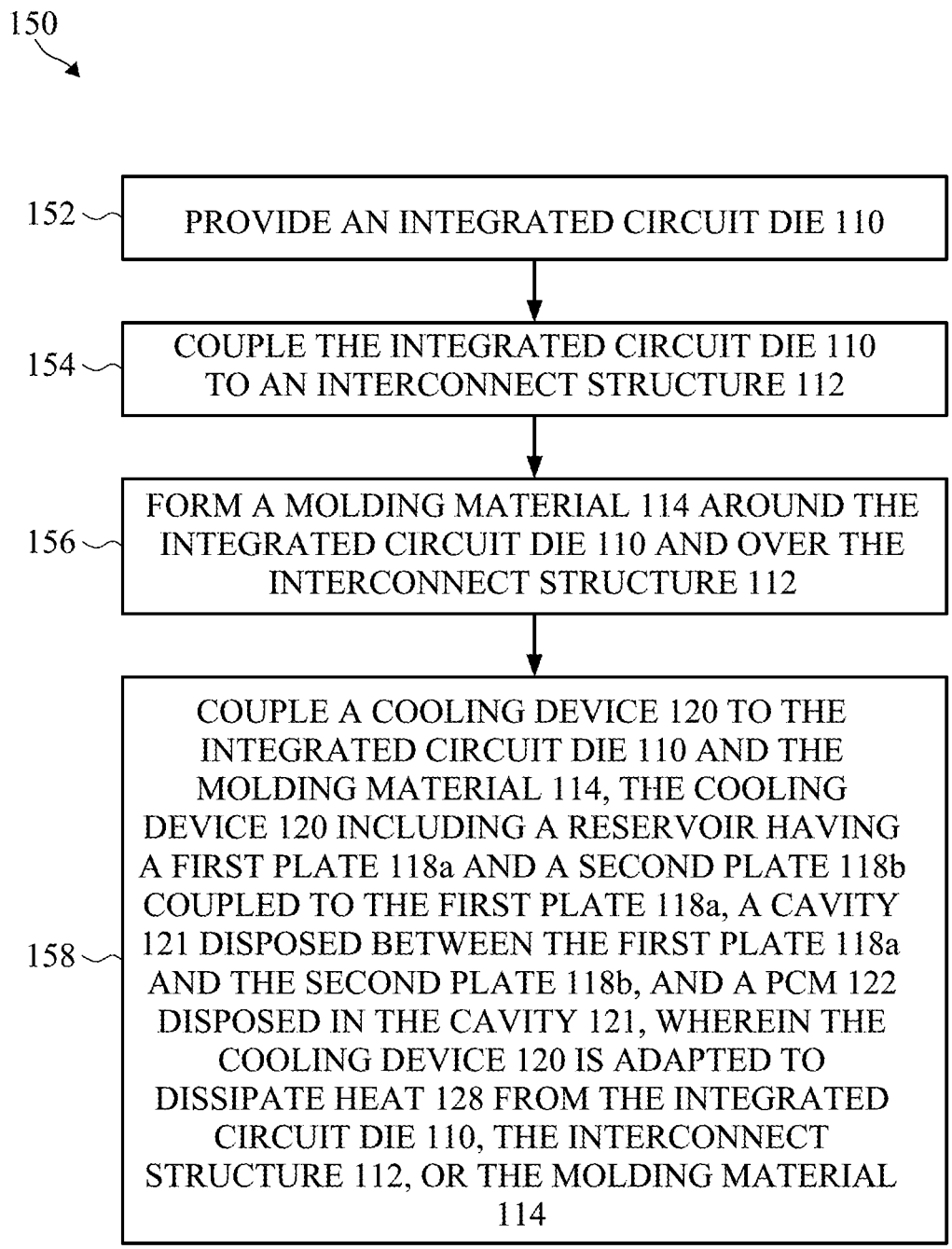
FIG. 24 is a flow chart that illustrates a method of packaging a semiconductor device in accordance with some embodiments.

FIG. 24 is a flow chart 150 of a method of packaging a semiconductor device in accordance with some embodiments of the present disclosure. In step 152, an integrated circuit die 110 is provided. In step 154, the integrated circuit die 110 is coupled to an interconnect structure 112. In step 156, a molding material 114 is formed around the integrated circuit die 110 and over the interconnect structure 112. In step 158, a cooling device 120 is coupled to the integrated circuit die 110 and the molding material 114, the cooling device 120 including a reservoir having a first plate 118a and a second plate 118b coupled to the first plate 118a, a cavity 121 disposed between the first plate 118a and the second plate 118b, and a PCM 122 disposed in the cavity 121, wherein the cooling device 120 is adapted to dissipate heat 128 from the integrated circuit die 110, the interconnect structure 112, or the molding material 114.

Dissipating heat from a hot spot 108 of an integrated circuit die or dies 110 is described herein. The interconnect structure 112 may also generate hot spots during operation, and the heat from the hot spots may dissipate through the molding material 114. The cooling devices 120 described herein advantageously are also adapted to dissipate heat from the interconnect structure 112 and/or the molding material 114 of packaged semiconductor devices 100, in some embodiments.

In some embodiments, the method of packaging the semiconductor device described in the flow chart 150 shown in FIG. 24 further comprises coupling the interconnect structure 112 to a substrate or PCB 102 using a plurality of connectors 104, as shown in FIG. 1. In some embodiments, the integrated circuit die 110, the interconnect structure 112, and the molding material 114 comprise a first packaged semiconductor device 100a, and the method further comprises coupling a second packaged semiconductor device 100b to the cooling device 120, as shown in FIG. 21. In yet other embodiments, the integrated circuit die 110, the interconnect structure 112, and the molding material 114 comprise a first packaged semiconductor device 100a, and the method further comprises coupling a second packaged semiconductor device 100b to the first packaged semiconductor device 100a, as shown in FIG. 26, which will be described further herein.

Figure 25:
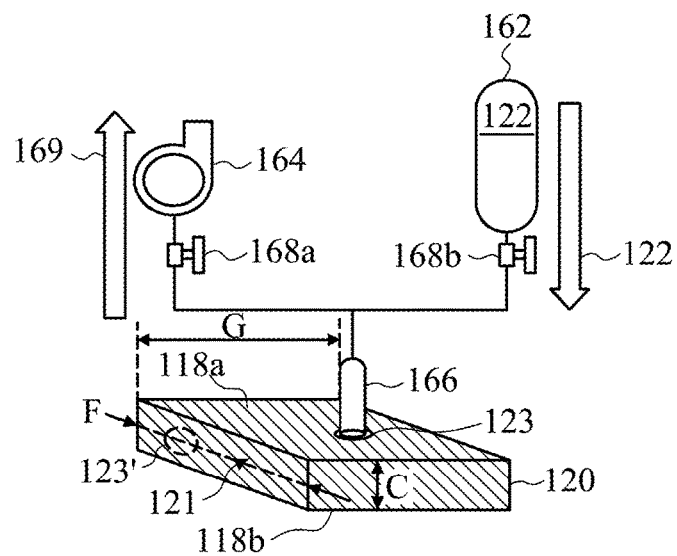
FIG. 25 is a block diagram that illustrates a method of disposing a PCM in a cooling device in accordance with some embodiments.

FIG. 25 is a block diagram that illustrates a method of disposing a PCM 122 in a cooling device 120 in accordance with some embodiments. A tube 166 is bonded to an opening 123 in the first plate 118a of the cooling device 120. The opening 123 may also be disposed on the second plate 118b, not shown, or the opening 123 may be disposed on an edge of the cooling device 120 between the first plate 118a and the second plate 118b, as shown in phantom (e.g., in dashed lines) in FIG. 25 at 123'. The opening 123 or 123' may also be located on an edge of the first plate 118a or on an edge of the second plate 118b, for example.

The opening 123 may be circular and have a diameter of about 2 mm to about 4 mm, for example. The opening 123 may also comprise other shapes and dimensions. The tube 166 comprises a glass tube having a length of about 10 mm to about 15 mm and a diameter of about 2 mm to about 4 mm in some embodiments, for example. The glass tube may comprise borosilicate glass in some embodiments. In other embodiments, the tube 166 may comprise plastic, rubber, silicone, or metal-based tubes or pipes. The tube 166 may also comprise other materials and dimensions.

A gas 169 (i.e., air or other gas) is then removed from the cavity 121 in the cooling device 120 through the tube 166 using a vacuum pump 164 that is controlled by a valve 168a. The PCM 122 is then flowed in liquid form in some embodiments from a container 162, also controlled by a valve 168b, through the tube 166 and into the cavity 121 of the cooling device 120. The tube 166 is then melted to form a plug 125 (not shown in FIG. 25; see FIG. 3) and seal the cooling device 120, i.e., using a high temperature flame gun at a temperature of about 850 degrees C. to about 1,000 degrees C. The cooling device 120 may also be sealed by soldering, welding, or an adhesive curing process, as examples. Other methods may also be used to seal the cooling device 120 or to form a plug 125. The plug 125 is adapted to retain the PCM 122 within the cavity 121 in the cooling device 120. The PCM 122 may also be introduced into the cooling device 120 using other methods.

Some dimensions of the cooling device 120 are also illustrated in FIG. 25. The cooling device 120 may comprise a substantially square or rectangular shape in a top view or a perspective view (shown in FIG. 25). The cooling device 120 comprising dimension C that was previously described herein with reference to FIG. 6. The cooling device 120 (and also the first plate 118a and the second plate 118b of the cooling device 120) may comprise a length comprising dimension F and a width comprising dimension G in some embodiments, wherein dimensions F and G comprise about 5 mm to about 60 mm in some embodiments, for example. Dimensions F and G may also comprise other dimensions, e.g., as a function of an end application that the cooling device 120 will be used in. The cooling device 120 may also comprise several smaller sized cooling devices placed side by side, not shown. The cooling device 120 may also comprise other dimensions and shapes.

In accordance with some embodiments of the present disclosure, a method of manufacturing a cooling device 120 for packaged semiconductor device 100 includes forming a reservoir comprising a first plate 118a, a second plate 118b coupled to the first plate 118a, and a cavity 121 disposed between the first plate 118a and the second plate 118b. The method includes disposing a PCM 122 in the cavity 121. In some embodiments, the first plate 118a, the second plate 118b, or an edge between the first plate 118a and the second plate 118b comprises an opening 123 or 123' therein as shown in FIG. 25, and disposing the PCM 122 comprises disposing the PCM 122 through the opening 123 or 123' into the cavity 121. The method may also comprise closing the opening 123 or 123' using a plug 125 (see FIG. 3). Referring again to FIG. 25, the method may further comprise removing a gas 169 from the cavity 121, before disposing the PCM 122. In some embodiments, the method may further comprise coupling a tube 166 to the opening 123 or 123', and disposing the PCM 122 through the tube 166 into the opening 123 or 123'. The method may further comprise removing the tube 166, after disposing the PCM 122.

Figure 26:
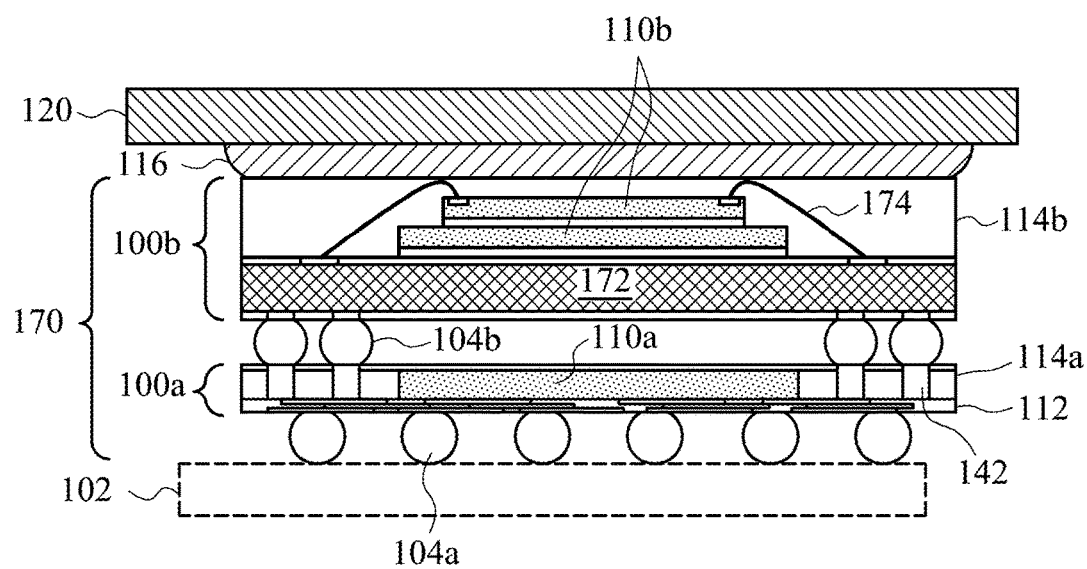
FIG. 26 is a cross-sectional view that shows a cooling device coupled to a package-on-package (POP) device in accordance with some embodiments.

FIG. 26 is a cross-sectional view that shows a cooling device 120 coupled to a package-on-package (POP) device 170 in accordance with some embodiments. In some embodiments, the integrated circuit die 110a, interconnect structure 112, and molding material 114a comprise a first packaged semiconductor device 100a. A second packaged semiconductor device 100b is coupled to the first packaged semiconductor device 100a by a plurality of connectors 104b, forming a POP device 170, before the cooling device 120 is coupled to the integrated circuit die 110a and the molding material 114a of the first packaged semiconductor device 100a via the second packaged semiconductor device 100b, in some embodiments. The cooling device 120 may also be coupled to the second packaged semiconductor device 100b before the first packaged semiconductor device 100a is coupled to the second packaged semiconductor device 100b, in other embodiments.

To manufacture the POP device 170, in some embodiments, before the first packaged semiconductor devices 100a are singulated, and after the molding material 114a is formed (and also planarized in some embodiments), a plurality of the second packaged semiconductor devices 100b is provided, and each of the plurality of second packaged semiconductor devices 100b is coupled to one of the first packaged semiconductor devices 100a using the plurality of connectors 104b. The plurality of second packaged semiconductor devices 100b is coupled to the unsingulated plurality of first packaged semiconductor devices 100a by a method such as manually by an operator or technician, the use of an automated machine such as a pick-and-place machine, or other methods. The eutectic material of the connectors 104b is heated, reflowing the eutectic material, and after the eutectic material cools, the second packaged semiconductor devices 100b are electrically and mechanically coupled to the first packaged semiconductor devices 100a. The plurality of first packaged semiconductor devices 100a is then singulated to form a plurality of the POP devices 170, one of which is illustrated in FIG. 26. The cooling device 120 is then coupled to a top surface of the second packaged semiconductor device 100b, in some embodiments.

The second packaged semiconductor device 100b may comprise a substrate 172 that includes a plurality of contact pads disposed on. The substrate 172 may include one or more interconnect structures (not shown) formed thereon that provide horizontal connections for the second packaged semiconductor device 100b in some embodiments. The substrate 172 may also include a plurality of through-vias (also not shown) formed therein. One or more integrated circuit dies 110b may be coupled to a top surface of the substrate 172. The second packaged semiconductor device 100b comprises two vertically stacked integrated circuit dies 110b in the embodiments shown in FIG. 26, for example. Two or more integrated circuit dies 110b may also be packaged together horizontally in the second packaged semiconductor device 100b in some embodiments, not shown.

In some of the embodiments shown, the integrated circuit dies 110b are coupled to contact pads disposed on a top surface of the substrate 172 by bond wires 174. The bond wires 174 and through-vias in the substrate 172 provide vertical electrical connections for the second packaged semiconductor device 100b in some embodiments. A molding material 114b is disposed over the integrated circuit dies 110b, the bond wires 174, and the substrate 172. The molding material 114b may comprise similar materials as described for the molding material 114 (labeled 114a in FIG. 26) of the first packaged semiconductor device 100a, for example.

In some embodiments, the integrated circuit die or dies 110b of the second packaged device 100b may comprise dynamic random access memory (DRAM) devices, for example. The integrated circuit dies 110b may also comprise other types of devices. The integrated circuit dies 110b may be packaged in a wire bond type of package as shown in FIG. 26, or the integrated circuit dies 110b may be packaged in other types of packages and using other types of packaging techniques.

The POP device 170 coupled to the cooling device 120 may be coupled to another device or object using a plurality of connectors 104a disposed on the bottom surface of the POP devices 170 that are coupled to the interconnect structure 112, e.g., using a surface mount technology (SMT) process. In some embodiments, the POP devices 170 may be coupled to a substrate or PCB 102, shown in phantom in FIG. 26.

The cooling device 120 is coupled to the first packaged semiconductor device 100a via the second packaged semiconductor device 100b and the plurality of connectors 104b, for example. The cooling device 120 is adapted to dissipate heat from integrated circuit die 110a and/or integrated circuit dies 110b, and also to dissipate heat from other components of the POP device 170, such as the interconnect structure 112 and molding material 114a of the first packaged semiconductor device 100a and interconnect structures within the substrate 172 and molding material 114b of the second packaged semiconductor device 100b.

In some embodiments, the integrated circuit dies 110a of the first packaged semiconductor device 100a comprise logic devices or processors and the interconnect structure 112 of the first packaged semiconductor device 100a comprises fan-out wiring, e.g., in some embodiments wherein the second integrated circuit dies 110b comprise memory devices such as DRAM devices, forming an InFO POP device 170. The first integrated circuit dies 110a, the second integrated circuit dies 110b, the first packaged semiconductor device 100a, and the second packaged semiconductor device 100b may also comprise other types of devices, and the cooling devices 120 described herein may also be implemented in other types of applications.

Figure 27:
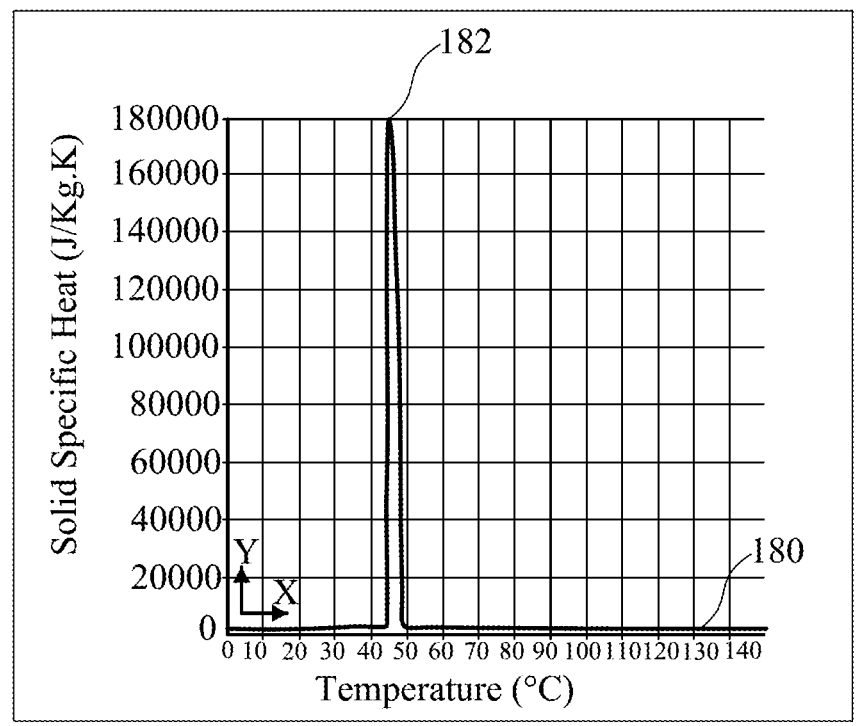
FIGS. 27 and 28 are graphs that illustrate simulation results for PCM properties in accordance with some embodiments of the present disclosure.
Figure 28:
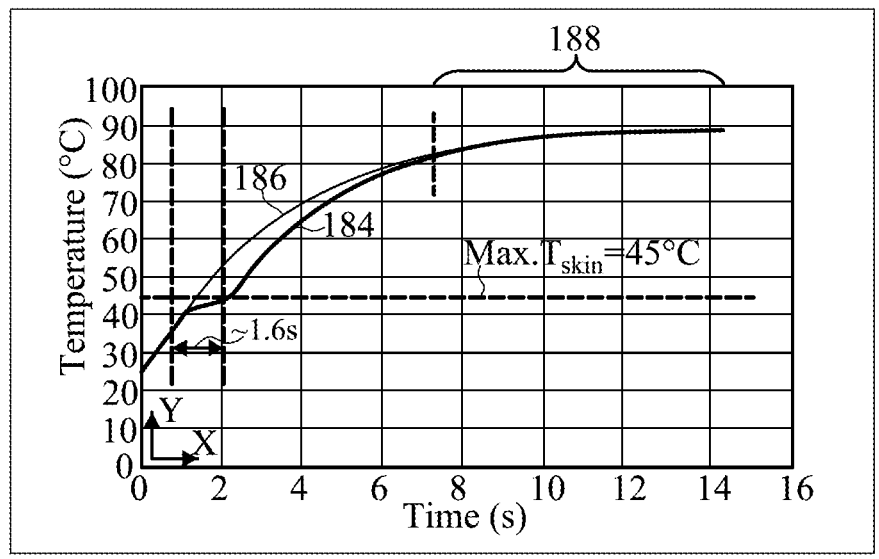

FIGS. 27 and 28 are graphs that illustrate simulation results of implementing a cooling device 120 described herein in accordance with some embodiments. In FIG. 27, a PCM 122 comprising wax was used in a transient thermal simulation analysis. The graph 180 illustrates solid specific heat or specific heat capacity (Cp) in units of joule/kg·Kelvin (J/Kg·K) on the y axis over a range of temperatures of the wax in degrees C. on the x axis. The Cp of the wax (i.e., paraffin wax) was assumed for the simulation to be about 180,000 J/(Kg·K) at the wax melting point of about 45 degrees C., as shown at 182. FIG. 28 is a graph showing temperature in degrees C. (° C.) on the y axis for a range of times in seconds (s) on the x axis. A graph of wax temperature/time is shown at 184, and a graph of water temperature/time is shown at 186. A maximum temperature for contact of a handheld device for contact with skin, Max. $T_{skin}$ is indicated at 45 degrees C. A steady state region is shown in the graphs at 188. The simulation results shown in the graphs indicate that wax has a better transient thermal performance as a PCM 122 than water. For example, wax was found to stay below the Max $T_{skin}$ temperature for a longer period of time than water by about 1.6 seconds. Thus, using wax as a PCM 122 achieves about 25% of operation time saving for chips (i.e., integrated circuit dies 110), thus advantageously providing longer chip retention time at below skin temperature $T_{skin}$.

Some embodiments of the present disclosure are implementable in and are particularly beneficial when used with packaged semiconductor devices that comprise InFO devices. The cooling devices 120 also have useful application in WLPs, wafer-level chip scale packages (WLCSPs), POP devices, system-on-a chip (SOC) devices, chip-on-wafer-on-substrate (CoWoS) devices, or other types of 3DICs in some embodiments, as examples. Embodiments of the present disclosure are also beneficial for and may be implemented in other types of devices or wafer level packaging that include integrated circuit dies with hot spots and other elements with elevated temperatures during operation of the devices, as other examples.

Some embodiments of the present disclosure include cooling devices 120 and packaged semiconductor devices 100, systems 131, and POP devices 170 that include the cooling devices 120 described herein. Other embodiments include methods of packaging semiconductor devices that include the cooling devices 120.

Advantages of some embodiments of the present disclosure include providing cooling devices, packaging methods, and structures that are cost effective and dissipate heat away from hot spots of integrated circuit dies and other elements of the packaged semiconductor devices, such as interconnect structures and molding materials. Low cost cooling solutions are provided by the PCM-containing cooling devices, which also provide improved transient thermal performance and improved reliability. Max $T_{skin}$ of mobile and handheld devices may be achieved without degrading electrical performance, such as delay time and retention time of integrated circuit dies, and operation time can be lengthened. The cooling devices advantageously enable cooling of packaged semiconductor devices below Max $T_{skin}$ in some embodiments. Thermal run-away of integrated circuit dies due to hot spots or thermal cross-talk may be reduced or eliminated by implementing the cooling devices on the packaged semiconductor devices. More than one type of PCM may be included in the cooling devices, enabling different heat dissipation and cooling rates for integrated circuit dies coupled to the cooling devices.

Some embodiments involve using the cooling devices as an integral part of a heat sink, reducing package z-profiles and resulting in effective device transient cooling. Other embodiments include a conformable member, which accommodates multiple package heights on a substrate or PCB. Some embodiments include cooling devices coupled to a heat pipe. The cooling devices are flexibly integrated to InFO and CoWoS devices, and are suitable for handheld devices and for use with system parts. The cooling devices have thin profiles and are easily integratable with packaged semiconductor devices. Furthermore, the cooling devices described herein are easily implementable into existing packaging process flows and structures.

In some embodiments, a cooling device for a semiconductor device includes a reservoir having a first plate and a second plate coupled to the first plate, and a cavity disposed between the first plate and the second plate. A PCM is disposed in the cavity. The cooling device is adapted to dissipate heat from a packaged semiconductor device.

In other embodiments, a packaged semiconductor device includes an integrated circuit die, an interconnect structure coupled to the integrated circuit die, and a molding material disposed around the integrated circuit die and over the interconnect structure. A cooling device is coupled to the integrated circuit die and the molding material. The cooling device includes a reservoir including a first plate and a second plate coupled to the first plate, and a cavity disposed between the first plate and the second plate. A PCM is disposed in the cavity. Edges of the second plate are coupled to edges of the first plate. The cooling device is adapted to dissipate heat from the integrated circuit die, the interconnect structure, or the molding material.

In yet other embodiments, a method of packaging a semiconductor device includes coupling an integrated circuit die to an interconnect structure. A molding material is formed around the integrated circuit die and over the interconnect structure. A cooling device is coupled to the integrated circuit die and the molding material. The cooling device includes a reservoir comprising a first plate and a second plate coupled to the first plate, and a cavity disposed between the first plate and the second plate. A PCM is disposed in the cavity. The cooling device is adapted to dissipate heat from the integrated circuit die, the interconnect structure, or the molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
   coupling an integrated circuit die to an interconnect structure;
   forming a molding material around the integrated circuit die; and
   directly coupling a cooling device to the integrated circuit die and the molding material through a thermal interface material (TIM) and an adhesive, the adhesive surrounding and contacting the TIM, wherein the TIM and the adhesive fill a space between the cooling device and the integrated circuit die and the molding material, the cooling device comprising:
      a reservoir comprising a first plate and a second plate coupled to the first plate;
      a cavity disposed between the first plate and the second plate; and
      a phase change material (PCM) disposed in the cavity, wherein the cooling device is adapted to dissipate heat from the integrated circuit die, the interconnect structure, or the molding material.

2. The method according to claim 1, wherein the PCM comprises a filler material.

3. The method according to claim 1, further comprising coupling the interconnect structure to a substrate or printed circuit board (PCB) using a plurality of connectors.

4. The method according to claim 1, wherein the integrated circuit die, the interconnect structure, and the molding material comprise a first packaged semiconductor device, and wherein the method further comprises coupling a second packaged semiconductor device to the first packaged semiconductor device.

5. The method according to claim 1, wherein the integrated circuit die, the interconnect structure, and the molding material comprise a first packaged semiconductor device, and wherein the method further comprises coupling a second packaged semiconductor device to the cooling device.

6. A method, comprising:
   forming a packaged die, the packaged die including an integrated circuit die and a molding compound, a top surface of the packaged die being co-planar with a top surface of the molding compound;
   coupling the packaged die to a substrate using a plurality of connectors;
   flowing an underfill between the packaged die and the substrate, the underfill extending along sidewalls of the plurality of connectors;
   forming a thermal interface material on a surface of the packaged die that is opposite to the surface of the packaged die that is closest to the substrate;
   coupling a cooling device to the thermal interface material, the cooling device being integrated with a heat sink, the heat sink comprising a recess, the cooling device being disposed within the recess, the cooling device being retained within the recess by an adhesive, wherein the cooling device comprises:
      a first plate;
      a second plate connected to the first plate; and
      a phase change material disposed in a cavity between the first plate and the second plate, the phase change material configured to change a phase upon application of heat to the first plate or the second plate.

7. The method according to claim 6, wherein coupling the cooling device to the thermal interface material comprises coupling the cooling device to the thermal interface material using a pick and place machine.

8. The method according to claim 6, wherein the first plate comprises a plurality of protrusions, the second plate comprises a plurality of protrusions, and wherein the protrusions of the first plate and the protrusions of the second plate are aligned.

9. The method according to claim 6, wherein the first plate comprises a plurality of protrusions, the second plate comprises a plurality of protrusions, and wherein the protrusions of the first plate and the protrusions of the second plate are offset from each other.

10. The method according to claim 6, wherein forming the packaged die comprises:
   placing a die on a carrier;
   forming molding material extending along sidewalls of the die; and
   forming a fan-out conductive structure over the die.

11. The method according to claim 10, wherein the thermal interface material contacts the molding material and the die.

12. The method according to claim 6, wherein a surface of the first plate that is closest to the second plate is substantially planar, and wherein a surface of the second plate that is closest to the first plate comprises a plurality of protrusions.

13. The method according to claim 6, wherein the phase change material comprises a material that changes phase at about 100° C. or less.

14. The method according to claim 6, further comprising:
   applying the phase change material into the cavity through an opening in the cooling device; and
   closing the opening in the cooling device using a plug.

15. A method, comprising:
   forming a cooling device, the cooling device comprising a first phase change material disposed in a first cavity and a second phase change material disposed in a second cavity, wherein the first cavity is completely sealed from the second cavity, and wherein the first phase change material changes phase upon application of heat to a first portion of the cooling device and the second phase change material changes phase upon application of heat to a second portion of the cooling device;
   coupling a first integrated circuit die to a substrate; and
   coupling the cooling device to the first integrated circuit die, the cooling device being coupled to a surface of the first integrated circuit die that is opposite to a surface of the first integrated circuit die that faces the substrate, wherein a thermal interface material is used to couple the first portion of the cooling device to the first integrated circuit die and to couple the second portion of the cooling device to a second integrated circuit die.

16. The method according to claim 15, wherein the first integrated circuit die has a height that is greater than a height of the second integrated circuit die, and the first cavity is coupled to the second cavity by a conformable material.

17. The method according to claim 15, wherein a sidewall of the cooling device that extends in the first cavity comprises a first plurality of protrusions, and a sidewall of the cooling device that extends in the second cavity comprises a second plurality of protrusions.

18. The method according to claim 15, further comprising coupling the cooling device to a system part, wherein the system part comprises a case, a housing, or a chassis.

19. The method according to claim 1, further comprising simultaneously planarizing the molding material and the integrated circuit die.

20. The method according to claim 16, wherein the conformable material comprises an elastomer material.

21. The method according to claim 15, further comprising forming a molding compound surrounding the first integrated circuit die, wherein at least a portion of the molding compound is disposed between the cooling device and the first integrated circuit die.

\* \* \* \* \*